United States Patent
Schumacher et al.

(10) Patent No.: US 12,309,983 B2
(45) Date of Patent: May 20, 2025

(54) REFRIGERATION SYSTEM OR A HEAT PUMP AND METHOD OF OPERATING A REFRIGERATION SYSTEM OR A HEAT PUMP

(71) Applicant: THERMO KING LLC, Minneapolis, MN (US)

(72) Inventors: Ryan Wayne Schumacher, Bloomington, MN (US); Esteban Canade Tarquini, Rubi (ES); Peadar Conneely, Galway (IE)

(73) Assignee: THERMO KING LLC, Minneapolis, MN (US)

( * ) Notice: Subject to any disclaimer, the term of this patent is extended or adjusted under 35 U.S.C. 154(b) by 217 days.

(21) Appl. No.: 18/162,832

(22) Filed: Feb. 1, 2023

(65) Prior Publication Data

US 2023/0247810 A1    Aug. 3, 2023

(30) Foreign Application Priority Data

Feb. 1, 2022  (EP) ..................................... 22382082

(51) Int. Cl.
*H05K 7/20* (2006.01)
(52) U.S. Cl.
CPC ..... *H05K 7/20936* (2013.01); *H05K 7/20336* (2013.01)
(58) Field of Classification Search
CPC ............ H05K 7/20936; H05K 7/20336; F25B 2400/05; F25B 2700/21154; F25B 41/00;
(Continued)

(56) References Cited

U.S. PATENT DOCUMENTS 5,062,274 A * 11/1991 Shaw .................... F25B 49/022
                                                        62/196.2
5,220,809 A      6/1993 Voss
(Continued)

FOREIGN PATENT DOCUMENTS

CN       1779384 A1 *  5/2006
EP       2645008        10/2013
(Continued)

OTHER PUBLICATIONS

WO 2017145276 A1 (Year: 2024).*
(Continued)

*Primary Examiner* — Eric S Ruppert
*Assistant Examiner* — Kirstin U Oswald
(74) *Attorney, Agent, or Firm* — HSML P.C.

(57) ABSTRACT

A refrigeration system or heat pump is provided that includes: a compressor, a condenser, a liquid line, an expansion device, an evaporator, and a suction line to the compressor. A power converter or module supplies electrical power. A first thermal coupling is formed between a first portion of a heat pipe and the power converter module. A second thermal coupling is formed between a second portion of the heat pipe and a component of the refrigeration system or heat pump. The heat pipe receives heat from the power converter or module at the first portion, transfer the heat from the first portion to the second portion and transfer the heat from the second portion to the component of the refrigeration system or heat pump so as to cool the power converter or module.

12 Claims, 18 Drawing Sheets

(58) Field of Classification Search
CPC .. F25B 1/00; F25B 2700/21153; F25B 30/00; F25B 41/31; F25B 49/022
USPC .......................................................... 62/117
See application file for complete search history.

(56) References Cited

U.S. PATENT DOCUMENTS

| | | | | |
|---|---|---|---|---|
| 5,471,850 | A * | 12/1995 | Cowans | F25B 1/10 62/223 |
| 5,488,828 | A * | 2/1996 | Brossard | F03G 7/04 60/641.6 |
| 6,116,040 | A | 9/2000 | Stark | |
| 8,312,734 | B2 * | 11/2012 | Lewis | F25B 13/00 62/238.7 |
| 8,893,522 | B2 | 11/2014 | Jojima | |
| 8,978,404 | B2 | 3/2015 | Okuda et al. | |
| 8,997,514 | B2 | 4/2015 | Azuma | |
| 9,163,885 | B2 | 10/2015 | Teraki | |
| 9,631,544 | B2 | 4/2017 | Uchida et al. | |
| 2006/0037336 | A1 * | 2/2006 | Bush | F25B 41/22 62/197 |
| 2007/0101740 | A1 * | 5/2007 | Akei | H10N 10/00 62/238.7 |
| 2012/0169067 | A1 * | 7/2012 | Ruan | F24H 4/06 290/1 R |
| 2018/0087816 | A1 * | 3/2018 | Lee | F25B 49/025 |
| 2018/0114890 | A1 * | 4/2018 | Chauvin | G21D 5/02 |

FOREIGN PATENT DOCUMENTS

| | | | | |
|---|---|---|---|---|
| EP | 3270496 | | 1/2018 | |
| EP | 3421902 | | 4/2020 | |
| EP | 3798538 | | 3/2021 | |
| JP | 5206483 | | 6/2013 | |
| JP | 2017227413 | A * | 12/2017 | |
| JP | 2020-170779 | | 10/2020 | |
| KR | 10-0921240 | | 10/2009 | |
| WO | 2016/003467 | | 1/2016 | |
| WO | WO-2017145276 | A1 * | 8/2017 | ................ F24F 1/24 |
| WO | WO-2017175345 | A1 * | 10/2017 | ................ F24F 1/22 |
| WO | WO-2018051499 | A1 * | 3/2018 | ................ F24F 1/24 |

OTHER PUBLICATIONS

WO-2017175345-A1 (Year: 2024).*
JP-2017227413-A (Year: 2024).*
WO-2018051499-A1 (Year: 2024).*
CN 1779384 A1 (Year: 2024).*
Extended European Search Report, issued in the corresponding EP patent application No. 22382082.0, dated Jul. 25, 2022, 7 pages.
Nakkaew et al., "Application of the heat pipe to enhance the performance of the vapor compression refrigeration system", Case Studies in Thermal Engineering, vol. 15, 2019, 9 pages.

* cited by examiner

REFRIGERATION SYSTEM OR A HEAT PUMP AND METHOD OF OPERATING A REFRIGERATION SYSTEM OR A HEAT PUMP

FIELD OF THE INVENTION

The invention relates to a refrigeration system or a heat pump and a method of operating a refrigeration system or a heat pump.

BACKGROUND

Refrigeration systems and heat pumps are commonly used to transfer heat between different environments. Power converters and power modules are commonly used to supply electrical power to components of refrigeration systems and heat pumps, such as compressors. However, operating a power converter or power module outside of its allowable temperature range or at an unstable temperature can negatively impact its performance and durability.

SUMMARY

In accordance with a first aspect, there is provided a refrigeration system or heat pump, comprising: a compressor, a condenser, a liquid line, an expansion device, an evaporator and a suction line; a flow path for a vapor compression cycle; a power converter or power module configured to supply electrical power; and a heat pipe having a first portion and a second portion. The flow path extends through the compressor, the condenser, the liquid line, the expansion device, the evaporator, and the suction line to the compressor. The first portion of the heat pipe and the power converter or power module are configured such that a first thermal coupling is formed between the first portion of the heat pipe and the power converter or power module. The second portion of the heat pipe and a component of the refrigeration system or heat pump are configured such that a second thermal coupling is formed between the second portion of the heat pipe and the component. The heat pipe is configured to receive heat from the power converter or power module at the first portion, transfer the heat from the first portion to the second portion and transfer the heat from the second portion to the component of the refrigeration system or heat pump so as to cool the power converter or power module.

The refrigeration system or heat pump may further comprise an injection line and an additional expansion device. The additional expansion device may be fluidically connected to the liquid line so as to receive fluid from the liquid line and may be configured to expand the fluid received from the liquid line so as to form expanded fluid. The compressor may be configured to receive the expanded fluid from the additional expansion device via the injection line. The second portion of the heat pipe and the injection line may be configured such that a second thermal coupling is formed between the second portion of the heat pipe and the injection line.

The refrigeration system or heat pump may further comprise an economizer heat exchanger, an injection line and an additional expansion device. The additional expansion device may be fluidically connected to the liquid line so as to receive fluid from the liquid line and may be configured to expand the fluid received from the liquid line so as to form expanded fluid. The compressor may be configured to receive the expanded fluid from the additional expansion device via the injection line. The economizer heat exchanger may be configured to thermally couple the injection line to the liquid line such that heat is transferred from the injection line to the liquid line.

The second portion of the heat pipe and the economizer heat exchanger may be configured such that a second thermal coupling is formed between the second portion of the heat pipe and the economizer heat exchanger.

A first portion of the injection line may fluidically connect the additional expansion device to the economizer heat exchanger. A second portion of the injection line may fluidically connect the economizer heat exchanger to the compressor. The second portion of the heat pipe and the first portion of the injection line may be configured such that a second thermal coupling is formed between the second portion of the heat pipe and the first portion of the injection line.

A first portion of the injection line may fluidically connect the additional expansion device to the economizer heat exchanger. A second portion of the injection line may fluidically connect the economizer heat exchanger to the compressor. The second portion of the heat pipe and the second portion of the injection line may be configured such that a second thermal coupling is formed between the second portion of the heat pipe and the second portion of the injection line.

The refrigeration system or heat pump may further comprise a further injection line and a further expansion device. A first portion of the injection line may fluidically connect the additional expansion device to the economizer heat exchanger. A second portion of the injection line may fluidically connect the economizer heat exchanger to the compressor. The further expansion device may be fluidically connected to the liquid line so as to receive fluid from the liquid line and may be configured to expand the fluid received from the liquid line so as to form expanded fluid. The second portion of the injection line may be configured to receive the expanded fluid from the further expansion device via the further injection line. The second portion of the heat pipe, the second portion of the injection line and the further injection line may be configured such that a second thermal coupling is formed between the second portion of the heat pipe, the second portion of the injection line and the further injection line.

The refrigeration system or heat pump may further comprise a suction to liquid line heat exchanger. The suction to liquid line heat exchanger may be configured to thermally couple the suction line to the liquid line such that heat is transferred from the liquid line to the suction line. The second portion of the heat pipe and the suction to liquid line heat exchanger may be configured such that a second thermal coupling is formed between the second portion of the heat pipe and the suction to liquid line heat exchanger.

The refrigeration system or heat pump may further comprise an injection line and an additional expansion device. The additional expansion device may be fluidically connected to the liquid line so as to receive fluid from the liquid line and may be configured to expand the fluid received from the liquid line so as to form expanded fluid. The liquid to suction line heat exchanger may be configured to receive the expanded fluid from the additional expansion device via the injection line.

The refrigeration system or heat pump may further comprise a suction to liquid line heat exchanger, an injection line and an additional expansion device. The suction to liquid line heat exchanger may be configured to thermally couple the suction line to the liquid line such that heat is transferred from the liquid line to the suction line. The additional expansion device may be fluidically connected to the liquid line so as to receive fluid from the liquid line and is configured to expand the fluid received from the liquid line so as to form expanded fluid. The liquid to suction line heat exchanger may be configured to receive the expanded fluid from the additional expansion device via the injection line. The second portion of the heat pipe and the injection line may be configured such that a second thermal coupling is formed between the second portion of the heat pipe and the injection line.

The second portion of the heat pipe and the evaporator may be configured such that a second thermal coupling is formed between the second portion of the heat pipe and the evaporator.

The second portion of the heat pipe and the condenser may be configured such that a second thermal coupling is formed between the second portion of the heat pipe and the condenser.

The first portion of the heat pipe and the power converter or power module may be mechanically and thermally coupled by a heat sink such that the first thermal coupling is formed between the first portion of the heat pipe and the power converter or power module.

The second portion of the heat pipe and the component of the refrigeration system or heat pump may be mechanically and thermally coupled by a heat exchanger such that the second thermal coupling is formed between the second portion of the heat pipe and the component, The power converter or power module may be configured to supply electrical power to the compressor so as to electrically power the compressor.

In accordance with a second aspect, a method of operating a refrigeration system or heat pump as stated in any preceding statements is provided. The method comprises: determining a parameter of the refrigeration system or heat pump; and modulating a variable component of the refrigeration system or heat pump based on the determined parameter. The variable component of the refrigeration system or heat pump is one or more of the expansion device, the additional expansion device, the further expansion device, the compressor and/or a flow control device for controlling the flow rate of refrigerant passing through the expansion device, the additional expansion device or the further expansion device.

The parameter of the refrigeration system or heat pump may be a temperature as determined by a temperature sensor disposed in or adjacent the power converter or power module. The variable component of the refrigeration system or heat pump may be modulated to reduce an error between the temperature and a target temperature or to bring the temperature within a target range of temperatures.

The parameter of the refrigeration system or heat pump may be a power dissipated by the power converter or power module.

LIST OF FIGURES

For a better understanding of the present invention, and to show more clearly how it may be carried into effect, reference will now be made, by way of example, to the accompanying drawings, in which:

FIG. 1 schematically shows a first example refrigeration system;

Figure 4:
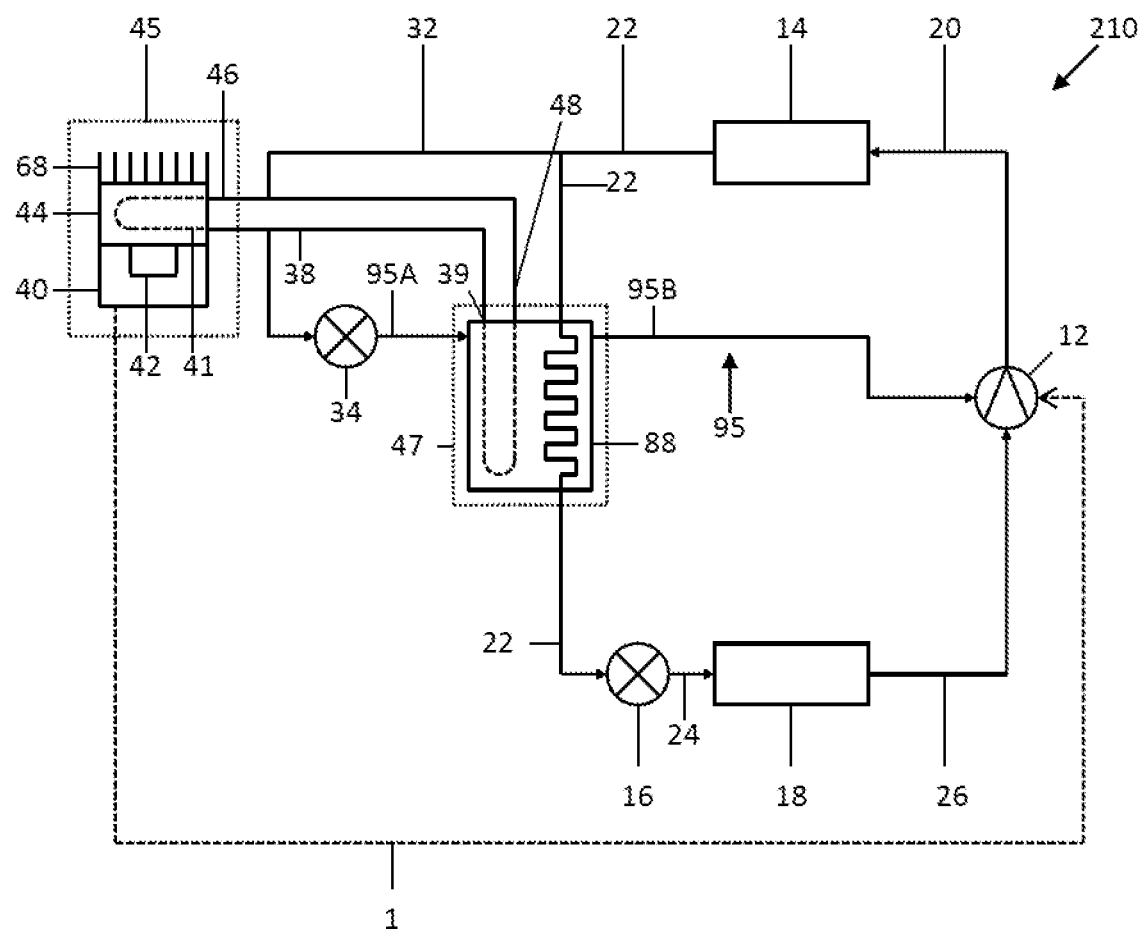
Figure 4:
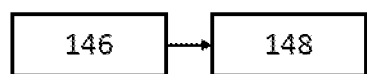
Figure 5:
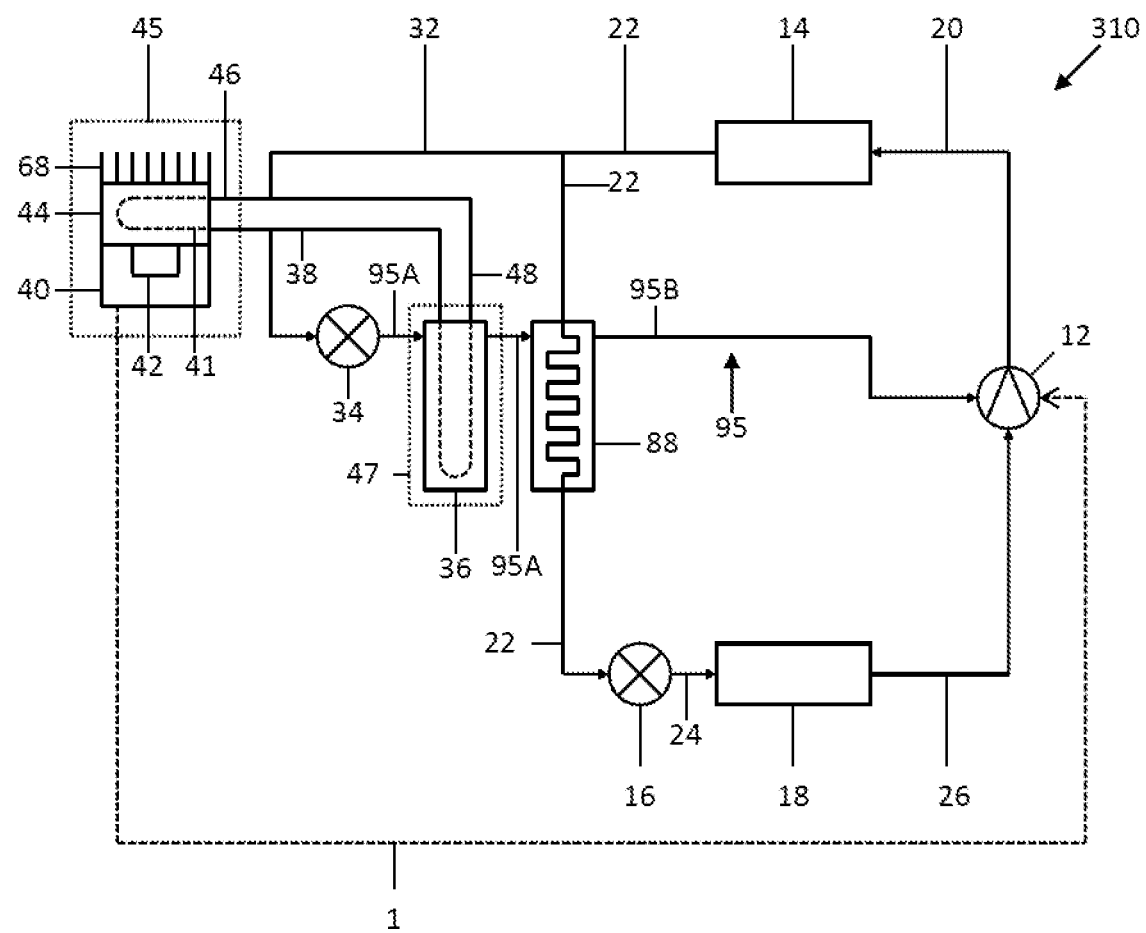
Figure 6:
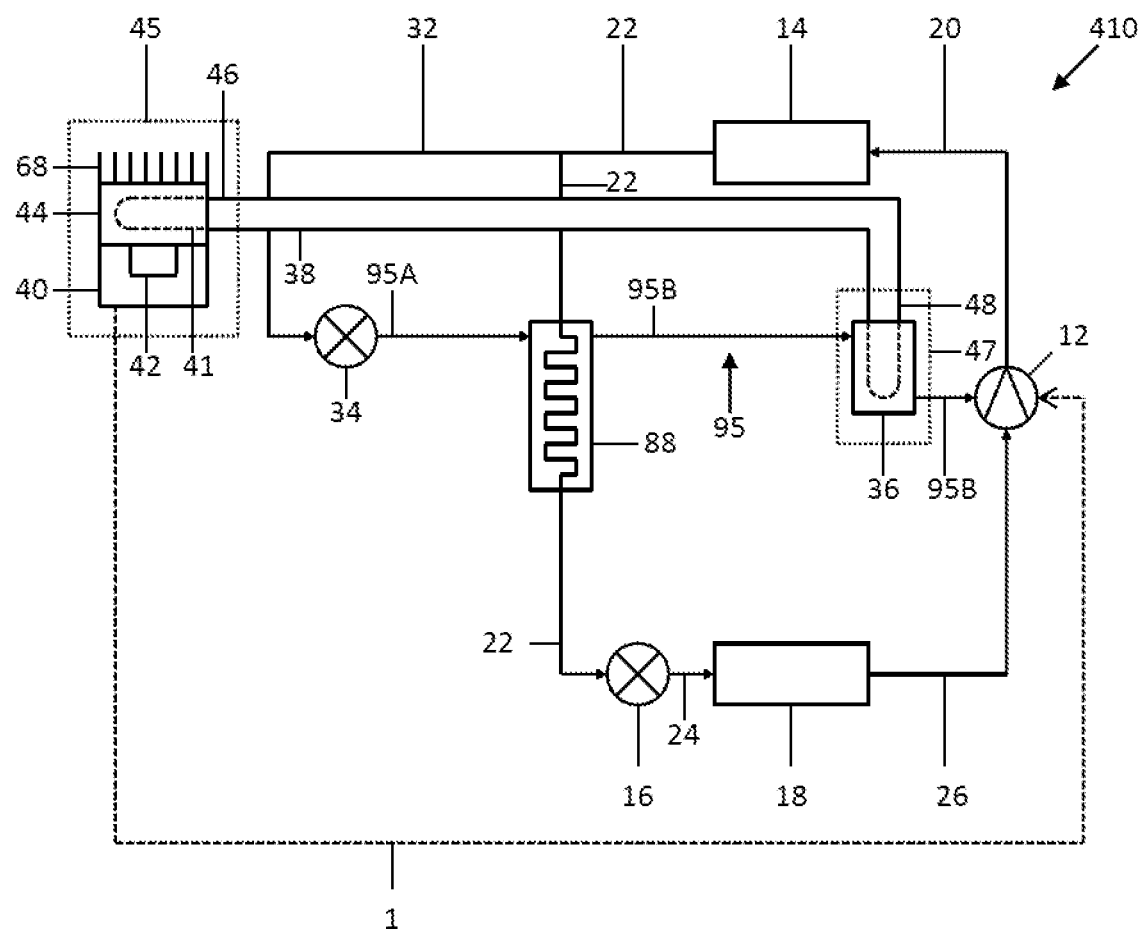
Figure 6:
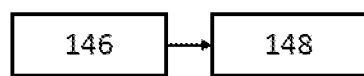
Figure 7:
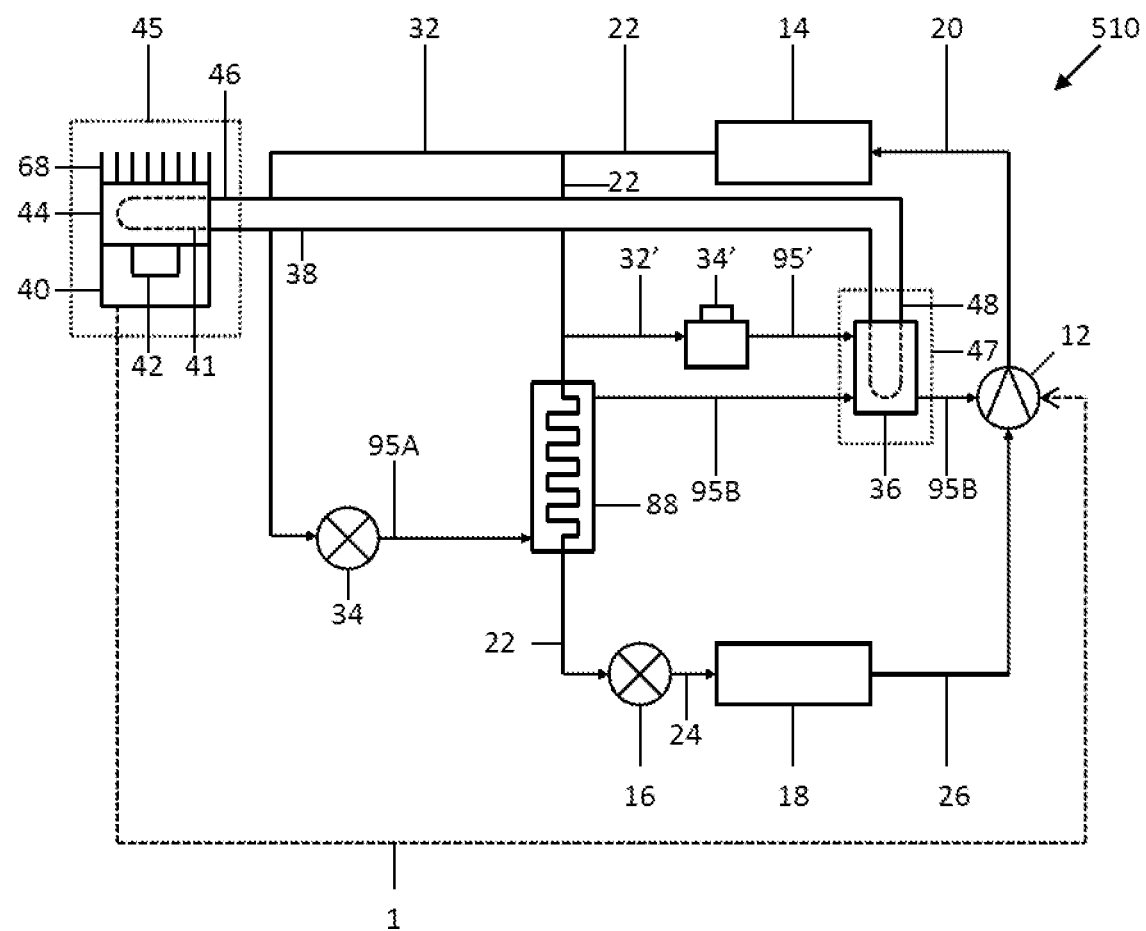
Figure 7:
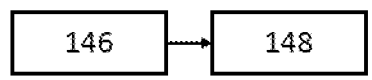
Figure 8:
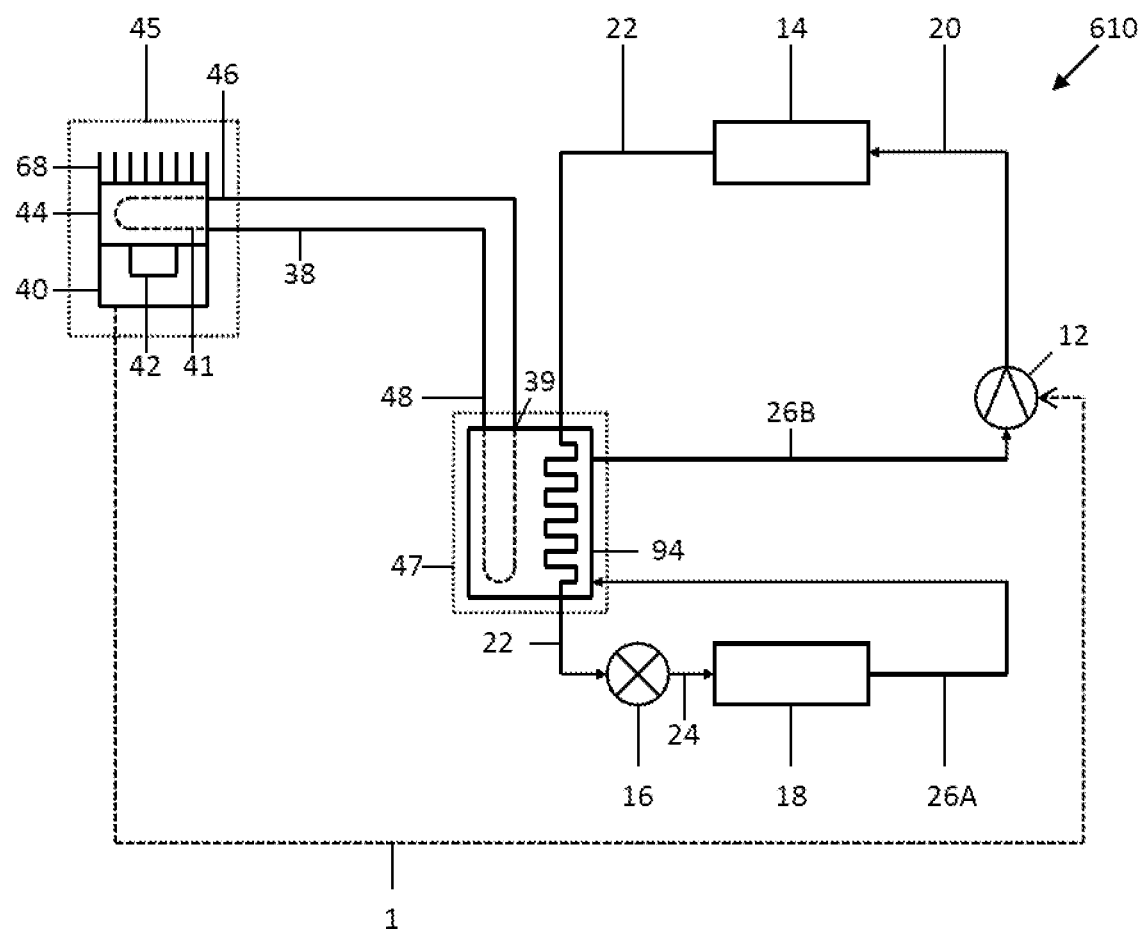
Figure 9:
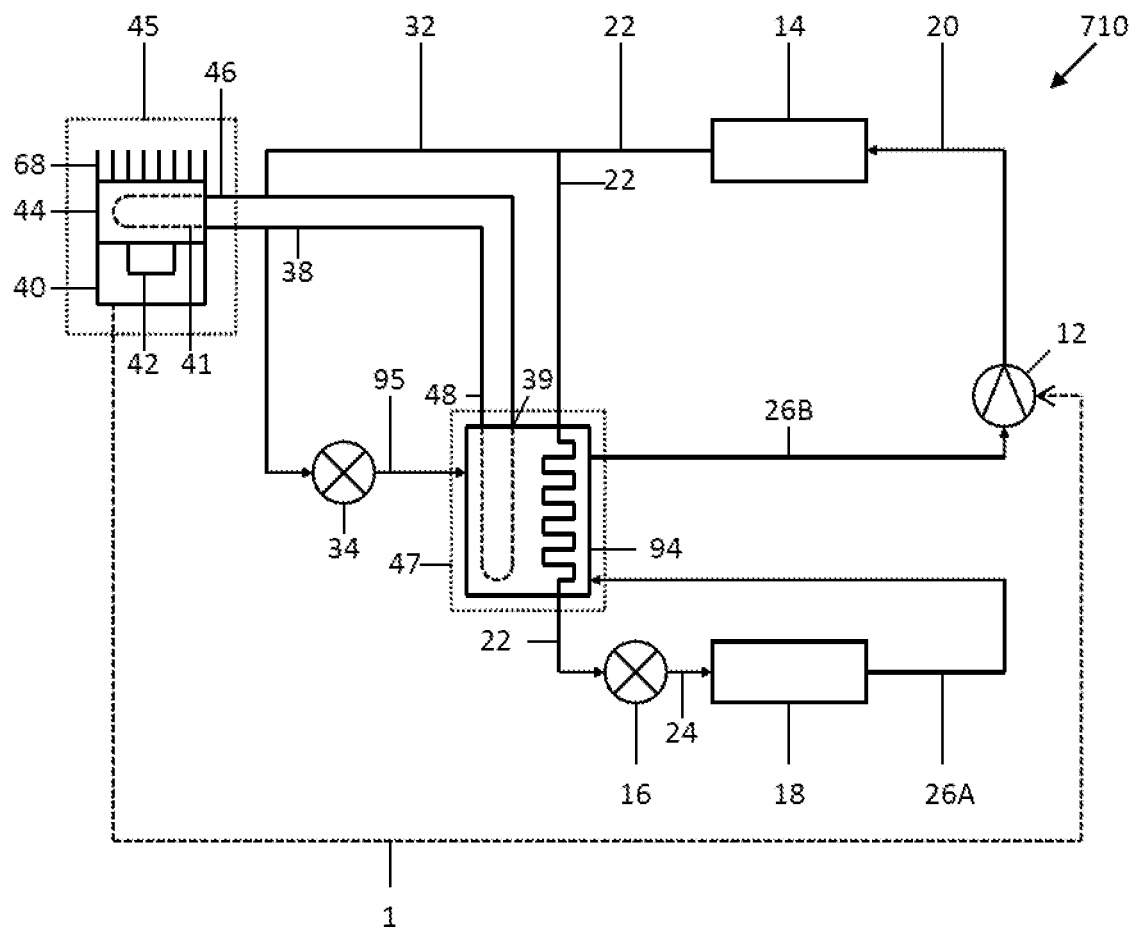
Figure 9:
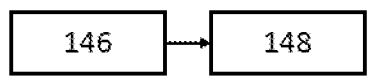
Figure 10:
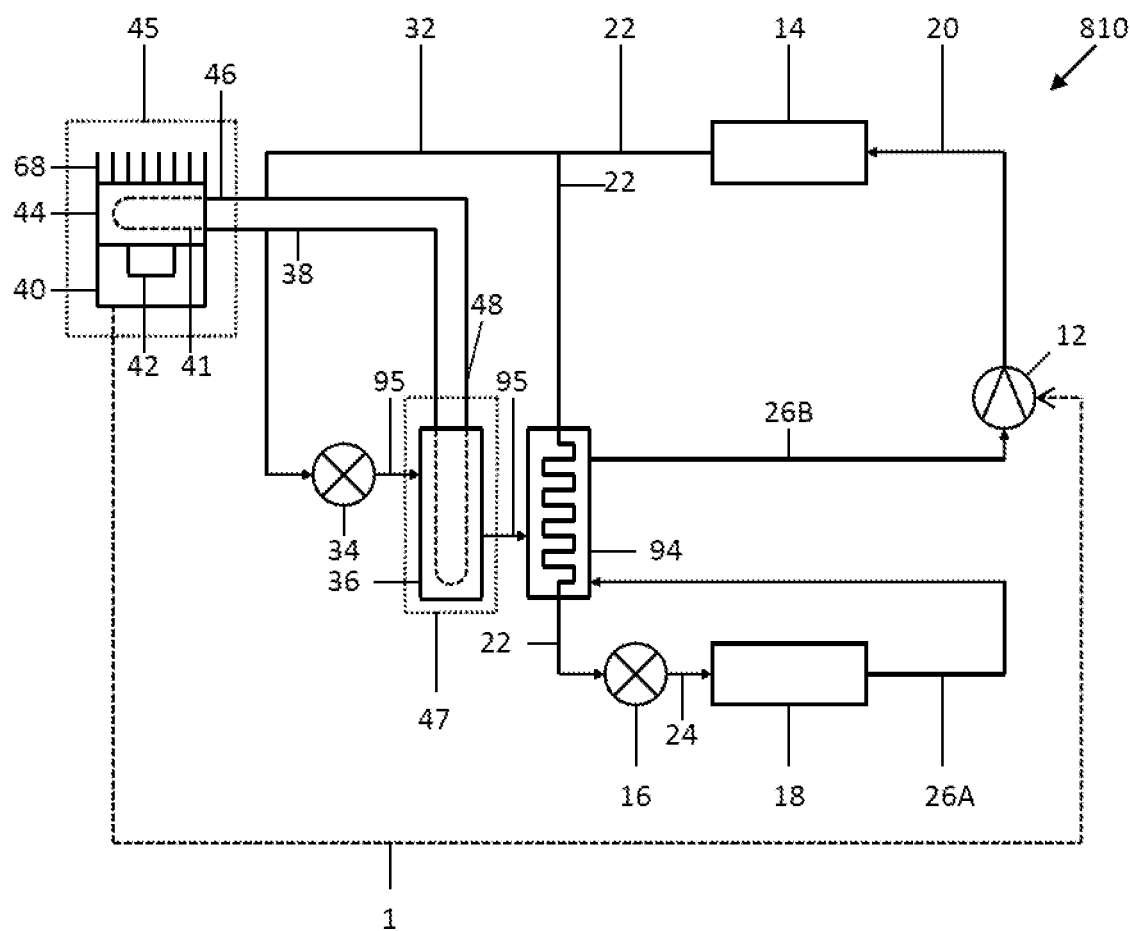

FIG. 4 schematically shows a second example refrigeration system;

FIG. 5 schematically shows a third example refrigeration system;

FIG. 6 schematically shows a fourth example refrigeration system;

FIG. 7 schematically shows a fifth example refrigeration system;

FIG. 8 schematically shows a sixth example refrigeration system;

FIG. 9 schematically shows a seventh example refrigeration system;

FIG. 10 schematically shows an eighth example refrigeration system; and

Figure 11:
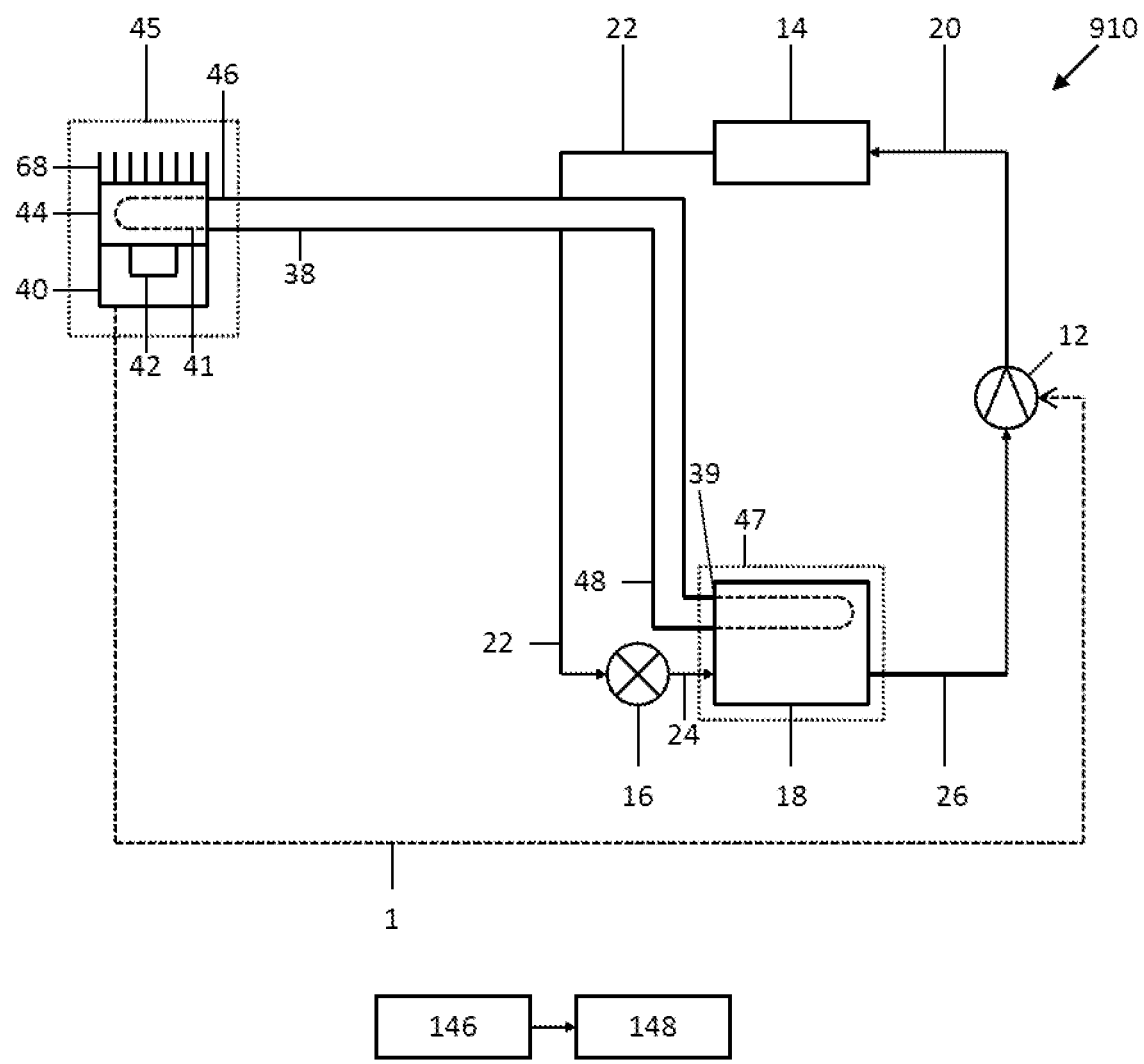
Figure 12:
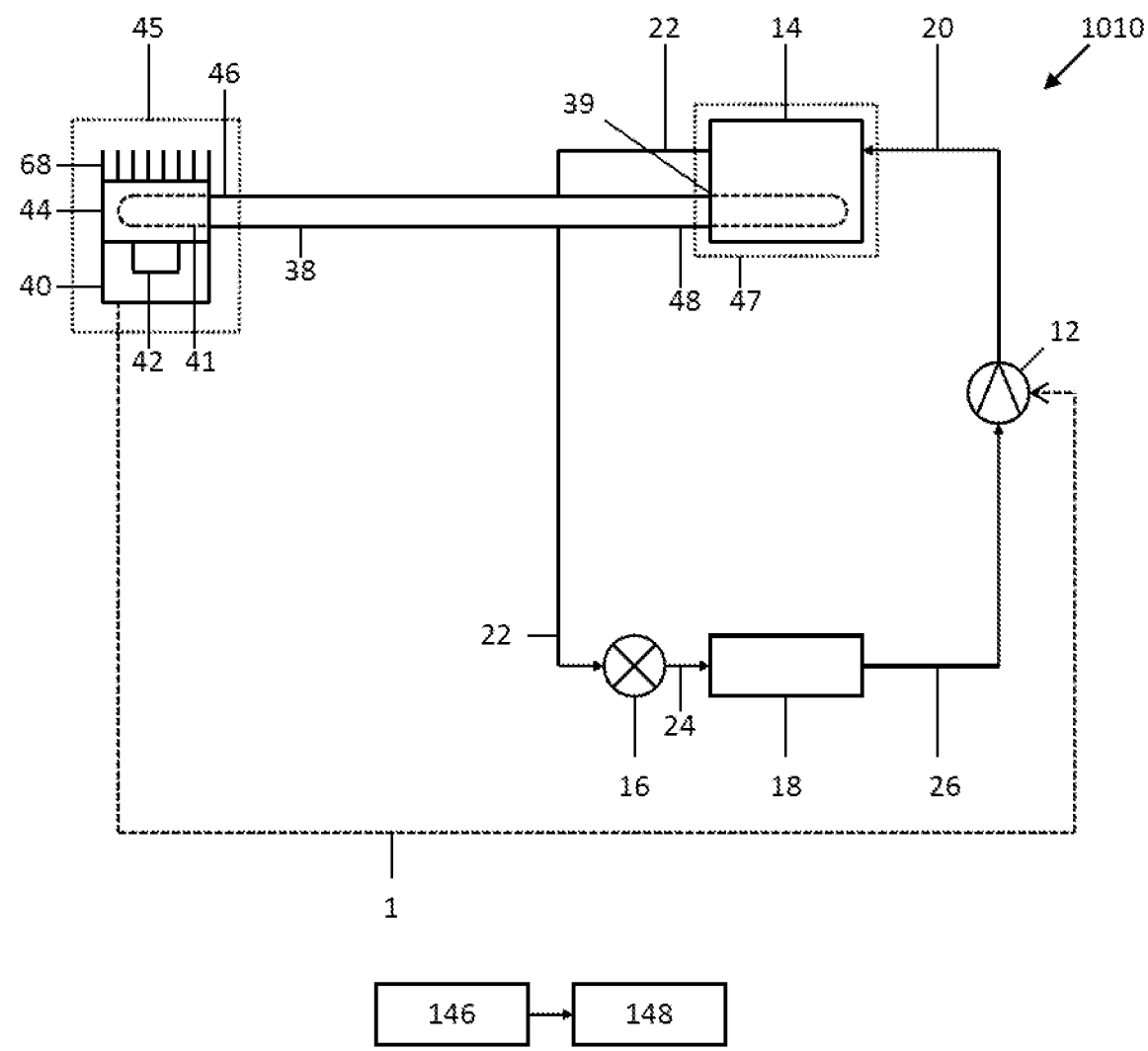
Figure 13:
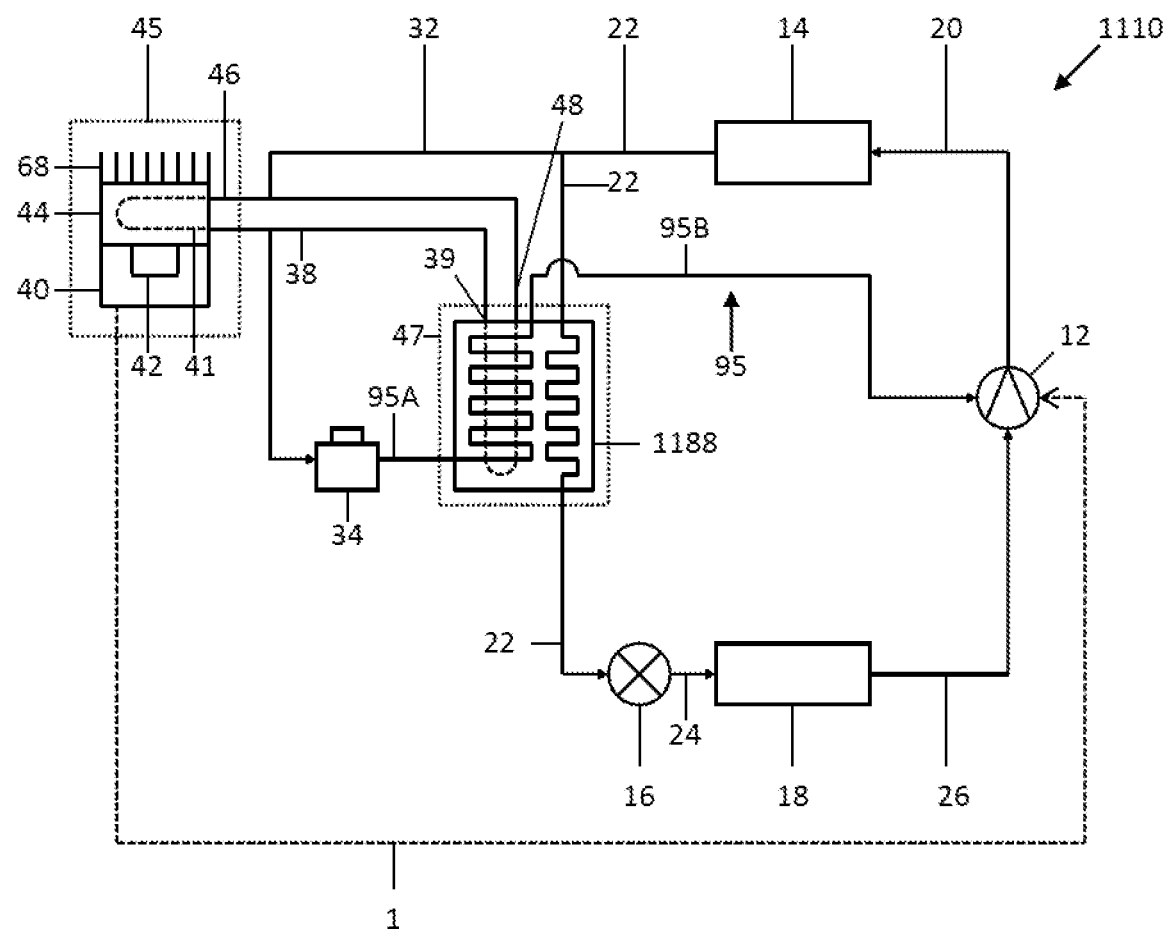
Figure 14:
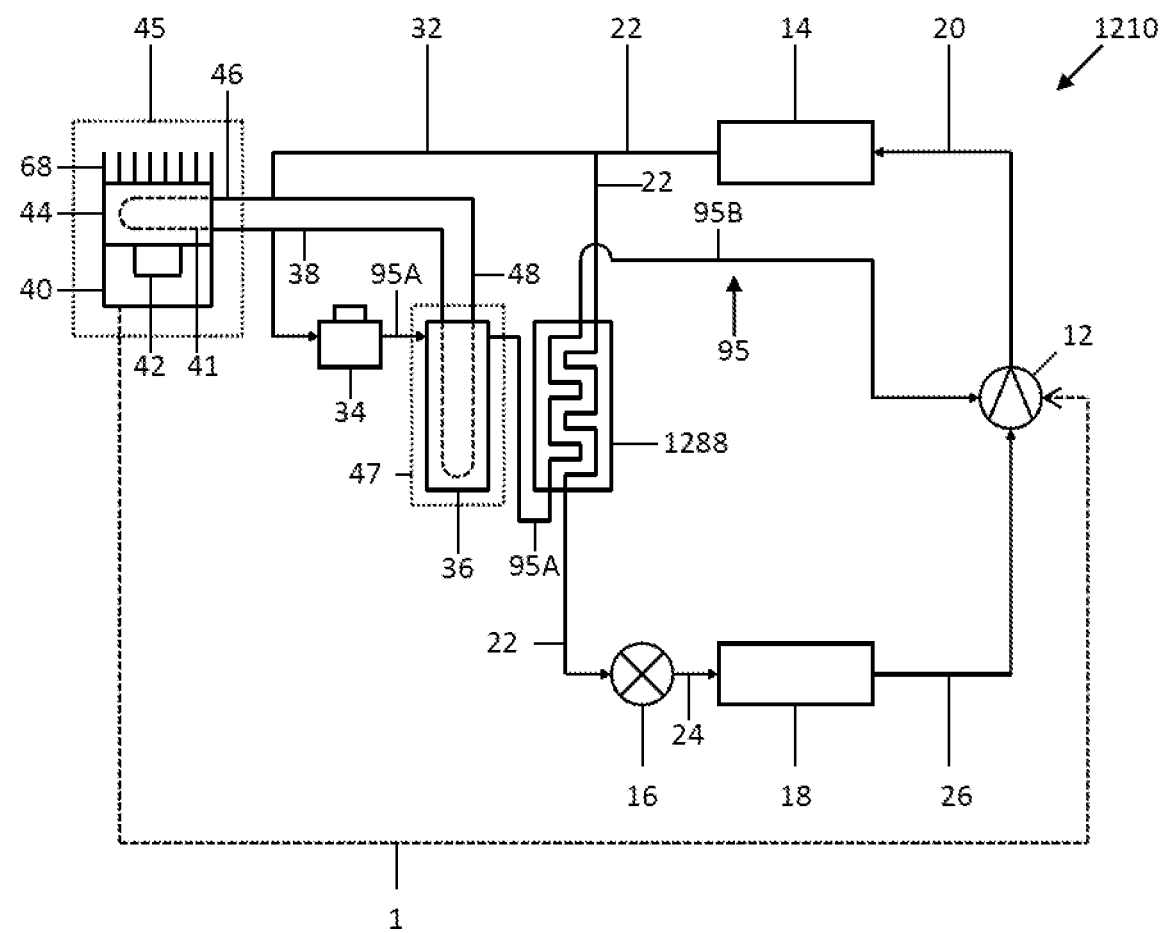
Figure 14:
Figure 15:
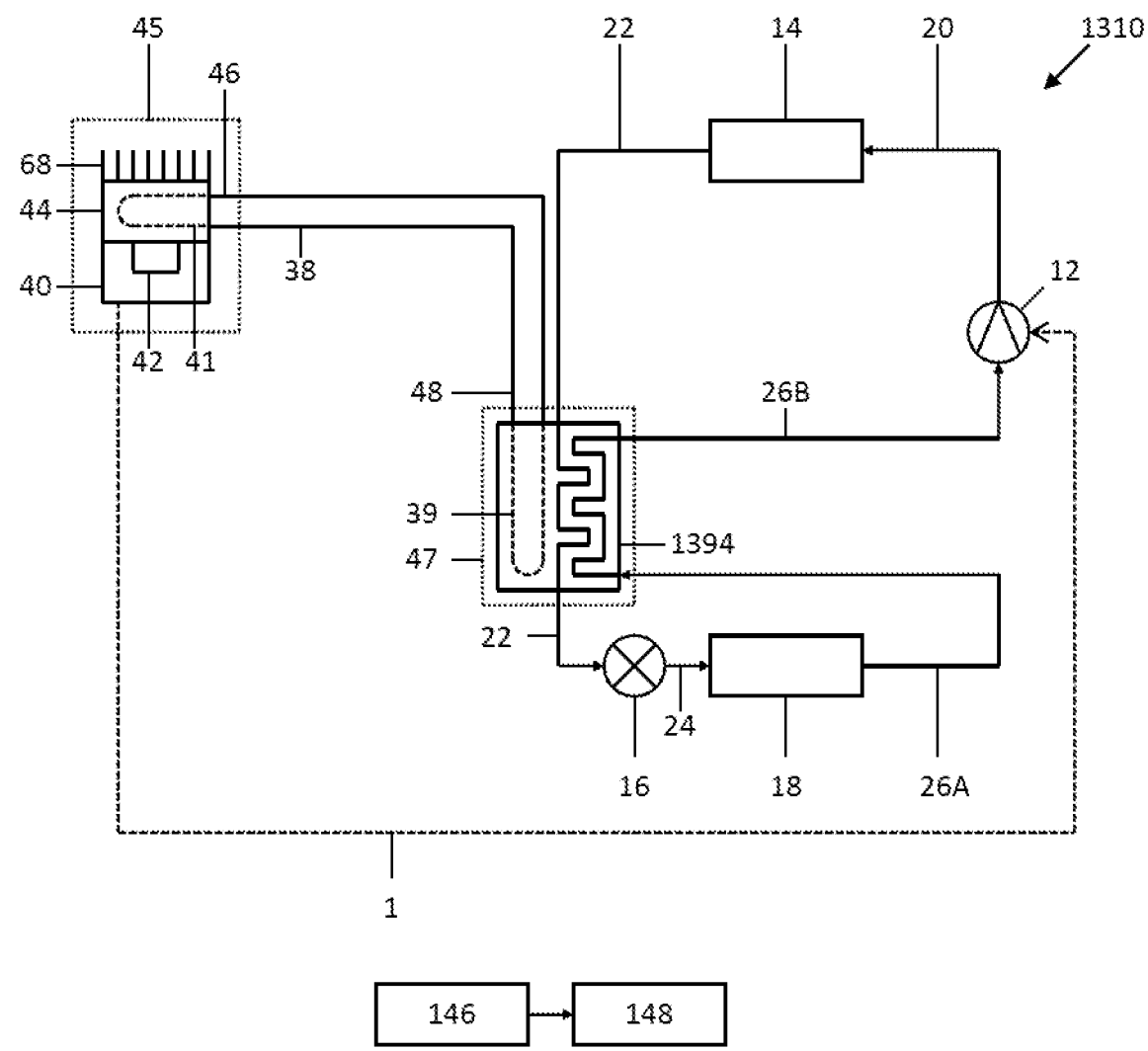
Figure 16:
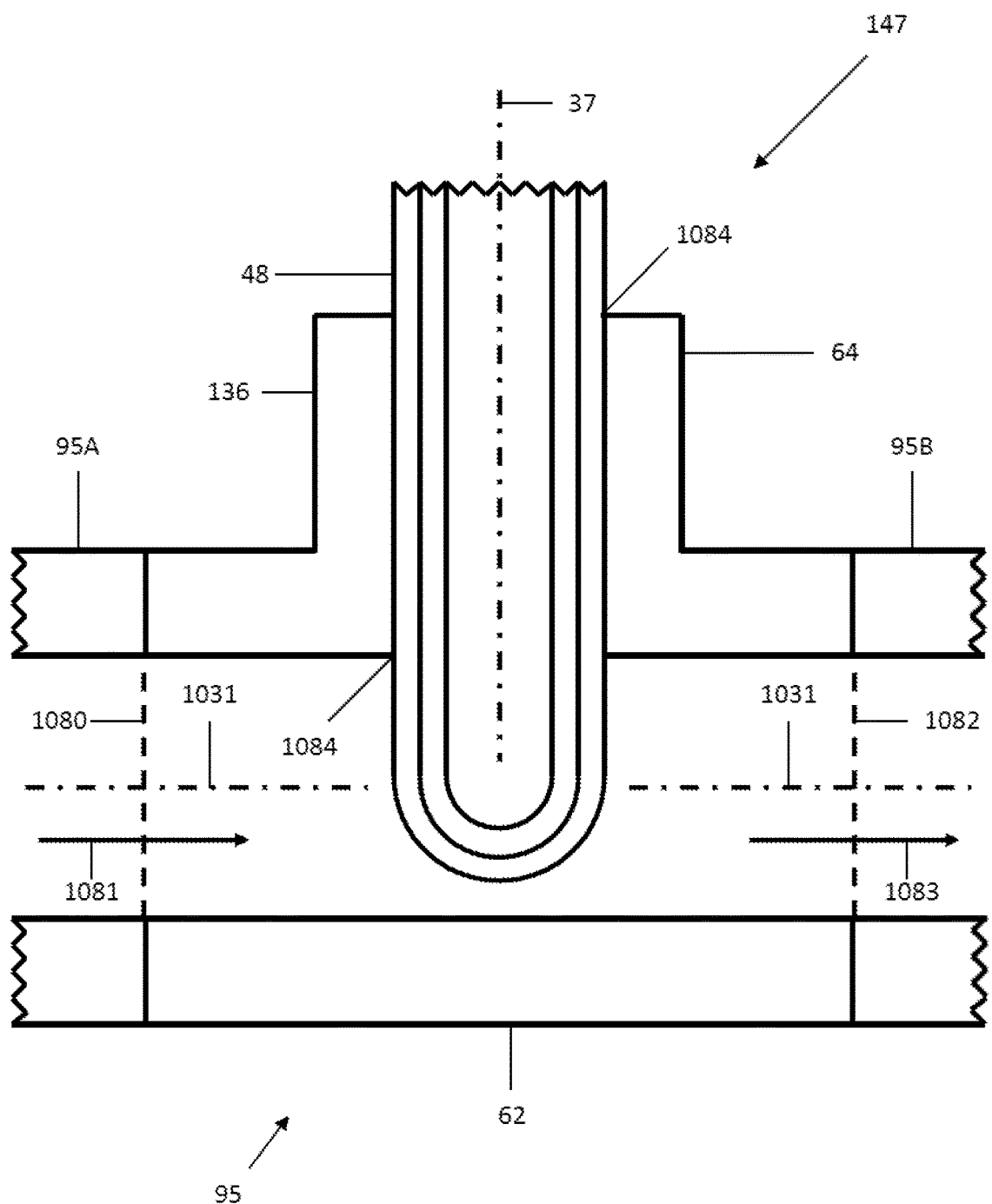
Figure 17:
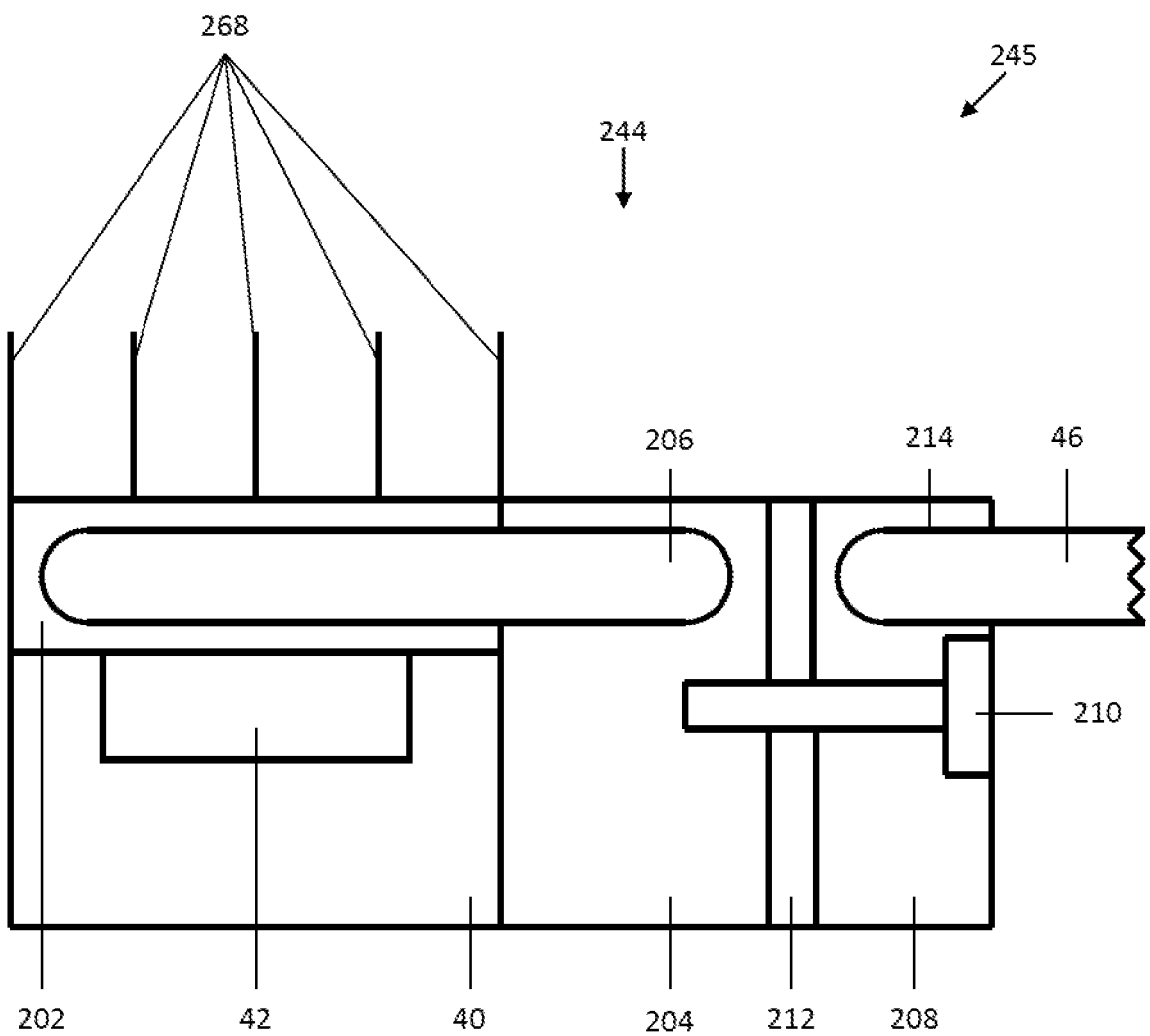
Figure 18:
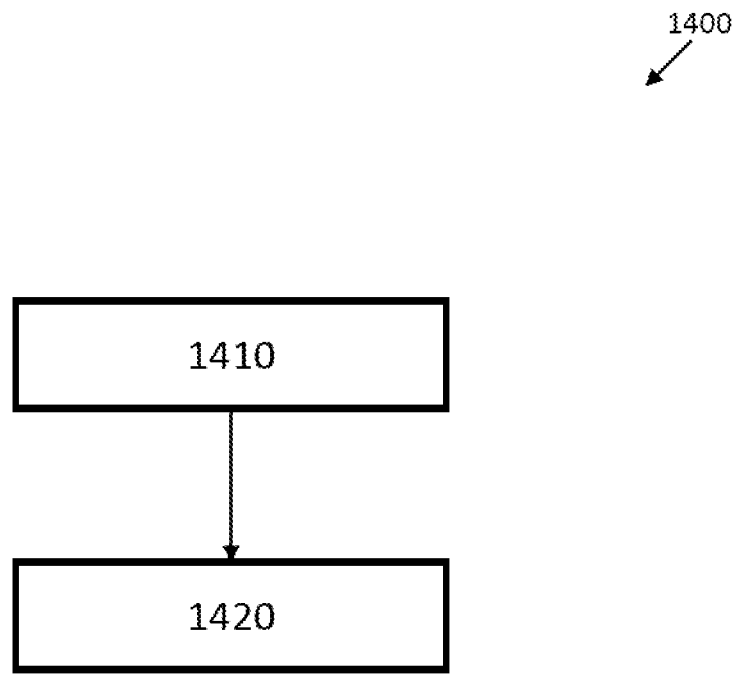

FIG. 11 schematically shows a ninth example refrigeration system;

FIG. 12 schematically shows a tenth example refrigeration system;

FIG. 13 schematically shows an eleventh example refrigeration system;

FIG. 14 schematically shows a twelfth example refrigeration system;

FIG. 15 schematically shows a thirteenth example refrigeration system;

FIG. 16 is a cross-sectional view of an alternative second thermal coupling formed between the second portion of the heat pipe and the injection line by an alternative heat pipe heat exchanger;

FIG. 17 is a cross-sectional view of an alternative thermal coupling between the heat pipe and a power converter of the refrigeration system; and FIG. 18 is a flowchart of a method of operating the refrigeration systems or heat pumps.

DETAILED DESCRIPTION

Figure 1:
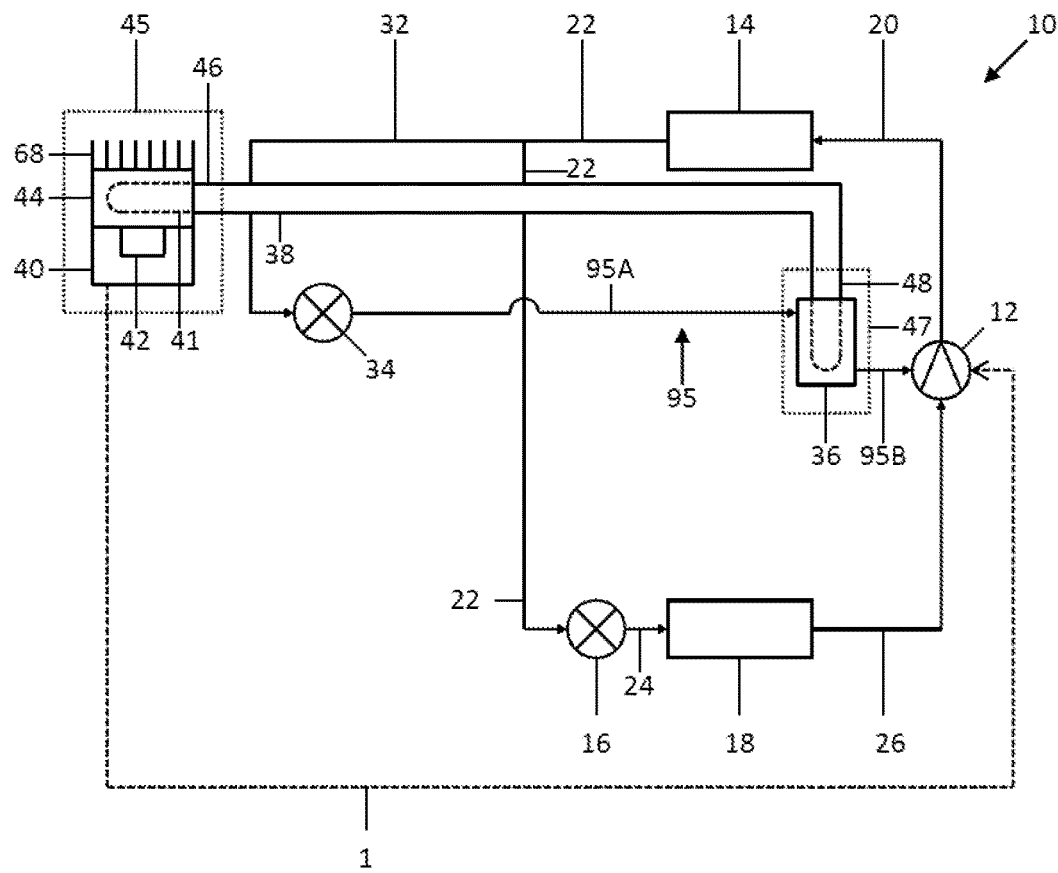

FIG. 1 schematically shows a first example refrigeration system 10 for transferring heat from one heat exchange medium to another, for example between a controlled environment and an ambient environment. The first example refrigeration system 10 is a vapor compression system and comprises a compressor 12, a condenser 14 for discharging heat to an ambient heat exchange medium, an expansion device 16, and an evaporator 18 for receiving heat from a controlled environment. The compressor 12 may be a rotary compressor (e.g. a two-stage rotary compressor with one or more vanes and lobes). The compressor 12 may alternatively be a scroll compressor, a reciprocating compressor, a centrifugal compressor or a screw compressor. The ambient heat exchange medium may be ambient air. The refrigeration system 10 is configured to operate in a cooling mode in order to maintain a set-point temperature in a controlled environment. The controlled environment may be air in a cargo space or process fluid/water in a chiller system, for example.

A main flow path extends through, in flow order, the compressor 12, the condenser 14, the expansion device 16, the evaporator 18, returning to the compressor 12. Making use of common terminology in the art for the respective fluid lines, the compressor 12, the condenser 14, the expansion device 16 and the evaporator 18 are fluidically connected by a discharge line 20, a liquid line 22, a distribution line 24 and a suction line 26. In particular, a discharge line 20 extends from the compressor 12 to the condenser 14 such that the compressor 12 is fluidically connected to the condenser 14. A liquid line 22 extends from the condenser 14 to the expansion device 16 such that the condenser 14 is fluidically connected to the expansion device 16. A distribution line 24 extends from the expansion device 16 to the evaporator 18 such that the expansion device 16 is fluidically connected to the evaporator 18. A suction line 26 extends from the evaporator 18 to the compressor 12 such that the evaporator 18 is fluidically connected to the compressor 12.

Although not shown, the first example refrigeration system 10 and the other refrigeration systems described herein may comprise additional components. For example, an oil separator may be disposed along the discharge line 20, an oil return line may extend from the oil separator to the suction line 26 and/or a receiver may be disposed along the liquid line 22. An electronic throttle valve may be disposed along the main flow path for controlling the flow of fluid along the main flow path. For example, the suction line 26 may be provided with electronic throttling valve or other valve for controlling the supply of fluid to the compressor 12. In the following description, the respective fluid lines may be described without reference to components located part-way along the line.

The refrigeration system 10 further comprises an injection line 95 (also referred to as a liquid injection line), an additional expansion device 34 (also referred to as an injection device, a liquid injection device, an injection valve or a liquid injection valve) and a supply line 32. A first end of the supply line 32 branches from and is fluidically connected to the liquid line 22. A second end of the supply line 32 is fluidically connected to the additional expansion device 34. Accordingly, the additional expansion device 34 is fluidically connected to the liquid line 22 by a supply line 32 so as to receive fluid from the liquid line 22. The additional expansion device 34 is configured to expand the fluid received from the liquid line 22 so as to form expanded fluid (also referred to as expanded liquid or saturated vapor). A first end of the injection line 95 is fluidically connected to the additional expansion device 34. A second end of the injection line 95 is fluidically connected to the compressor 12. Accordingly, the compressor 12 is configured to receive the expanded fluid from the additional expansion device 34 via the injection line 95.

A heat pipe heat exchanger 36 is disposed along the injection line 95 between a first portion of the injection line 95A (fluidically connected to the additional expansion device 34) and a second portion of the injection line 95B (fluidically connected to the compressor 12). Accordingly, the heat pipe heat exchanger 36 is disposed in flow series between the first portion of the injection line 95A and the second portion of the injection line 95B.

The first example refrigeration system 10 further comprises a power converter 40 (i.e. a device that converts electrical energy from one form to another). The power converter 40 may be any type of power converter. For example, the power converter may be a power inverter, and, thus, convert direct current (DC) to alternating current (AC). The power converter 40 may alternatively be a power rectifier, and, thus, convert AC to DC. The power converter 40 may alternatively be a power transformer, and, thus, change the voltage and/or current and/or frequency of AC between circuits. The power converter 40 may alternatively be a DC-to-DC converter, and, thus, change the voltage and/or current of DC between circuits. The DC-to-DC converter may comprise an intermediary AC stage. The power converter 40 may be bi-directional.

The power converter 40 comprises a heat generating component 42. The heat generating component 42 may be semiconductor device, for example an electronic switch in the form of an insulated-gate bipolar transistor (IGBT) having a die attached to a direct bonded copper (DBC) substrate. The heat generating component 42 may be able to generate temperatures of up to approximately 175° C., which may be its maximum junction temperature. The temperature of heat generating component 42 may be cooled using the heat pipe 38 to temperatures below the maximum temperature (i.e. below the maximum junction temperature). The temperature of the heat generating component 42 may be limited by cooling to temperatures between approximately 60° C. and 90° C., for example. The power converter 40 is configured to supply electrical power. For example the power converter 40 is configured to supply electrical power to the compressor 12 via an electrical supply line 1 so as to electrically power the compressor 12. The power converter 40 converts electrical energy such that it able to supply electrical energy that is better matched to the load.

The first example refrigeration system 10 further comprises a heat pipe 38 comprising a first portion 46 and a second portion 48. The first portion 46 is defined at a first end of the heat pipe 38. The second portion 48 is defined at a second end of the heat pipe 38. The first portion 46 of the heat pipe 38 and the power converter 40 are configured such that a first thermal coupling 45 is formed between the first portion 46 of the heat pipe 38 and the power converter 40. In particular, the power converter 40 is physically and thermally coupled to a heat sink 44 formed of thermally conductive material such that the heat sink 44 receives heat generated by the heat generating component 42. The heat sink 44 defines a hole 41 (represented in dashed lines in FIG. 1) that receives the first portion 46 of the heat pipe 38 such that the first portion 46 of the heat pipe 38 receives heat from the heat sink 44. Accordingly, the heat sink 44 is a mechanical and thermal coupling between the first portion 46 of the heat pipe 38 and the power converter 40. The heat pipe 38 may be connected to the hottest part of the heat sink 44, for example directly below the semiconductor die 42. The heat sink 44 further comprises a plurality of fins 68 configured to remove excess heat that is not transferred to the first portion 46 of the heat pipe 38 to the surrounding atmosphere.

The second portion 48 of the heat pipe 38 and a component of the first example refrigeration system 10 are configured such that a second thermal coupling 47 is formed between the second portion 48 of the heat pipe 38 and the component of the first example refrigeration system 10. In the first example refrigeration system 10 and as explained below in more detail, the second portion 48 of the heat pipe 38 and the injection line 95 are configured such that a second thermal coupling 47 is formed between the second portion 48 of the heat pipe 38 and the injection line 95.

Figure 2:
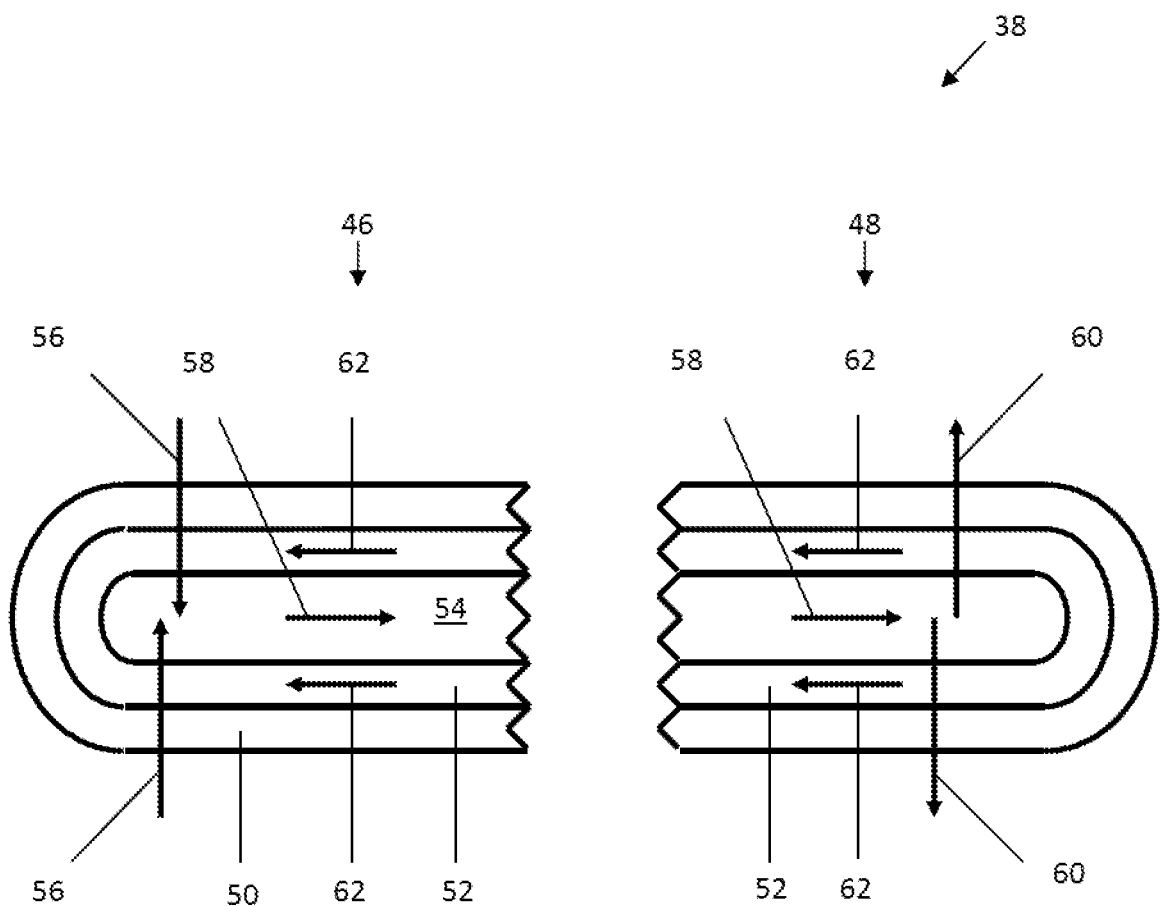
FIG. 2 is a cross-sectional view of a heat pipe of the first example refrigeration system.

FIG. 2 is a cross-sectional view of the heat pipe 38. The heat pipe 38 comprises a casing 50, a wick 52 and a cavity 54. The casing 50 is tubular and surrounds the wick 52. The casing 50 may be formed of copper. The wick 52 is also tubular and defines the cavity 54. The wick 52 may be a powder metal wick. A working fluid (e.g. distilled water) is disposed within the cavity 54 in a vacuum, which lowers its boiling point. The heat pipe 38 may be electrically non-conductive.

Figure 3:
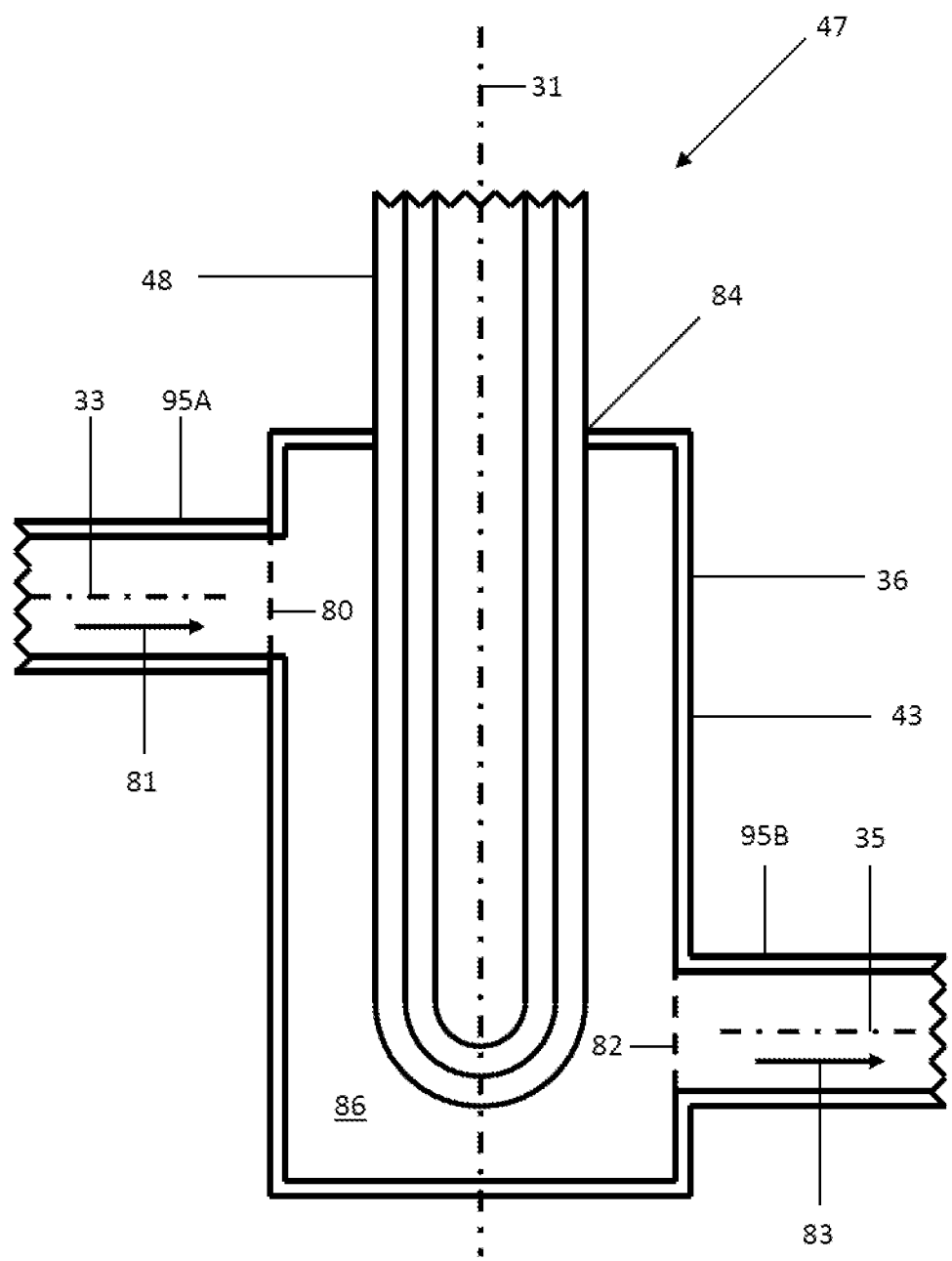
FIG. 3 is a cross-sectional view of a second thermal coupling formed between a second portion of the heat pipe and an injection line by a heat pipe heat exchanger of the first example refrigeration system.

FIG. 3 is a cross-sectional view of the second thermal coupling 47 formed between the second portion 48 of the heat pipe 38 and the injection line 95 by the heat pipe heat exchanger 36. The heat pipe heat exchanger 36 comprises a manifold 43 having an inlet opening 80 (shown in dashed lines in FIG. 3), an outlet opening 82 (also shown in dashed lines in FIG. 3) and a heat pipe opening 84. The manifold 43 defines an interior chamber 86. The manifold 43 is cylindrical and extends around a central axis 31. The first portion 95A of the injection line 95 is coupled to the inlet opening 80 and the second portion 95B of the injection line 95 is coupled to the outlet opening 82. The first portion 95A of the injection line 95 and the second portion 95B of the injection line 95 are cylindrical and extend around respective axes 33, 35. The second portion 48 of the heat pipe 38 extends into the interior chamber 86 via the heat pipe opening 84. The second portion 48 of the heat pipe 38 is mechanically coupled to the injection line 95 by the heat pipe heat exchanger 36.

Returning to FIGS. 1 and 2, the heat pipe 38 is configured to receive heat from the power converter 40 at the first portion 46, transfer the heat from the first portion 46 to the second portion 48 and transfer the heat from the second portion 48 to the component of the refrigeration system so as to cool the power converter 40. In particular, during operation of the power converter 40, heat generated by the power converter 40 passes into the power converter heat sink 44. This heat then passes from the power converter heat sink 44 into the cavity 54 of the heat pipe 38 at the first portion 46 of the heat pipe 38, shown schematically using arrows 56 in FIG. 2. The temperature of the working fluid at the first portion 46 of the heat pipe 38 increases and the working fluid at the first portion 46 of the heat pipe 38 boils or evaporates. The vapour migrates along the cavity 54 from the first portion 46 of the heat pipe 38 to the second portion 48 of the heat pipe 38, shown schematically using arrows 58. At the second portion 48 of the heat pipe 38, the vapour condenses back to fluid, the fluid is absorbed by the wick 52, and heat is transferred out of the heat pipe 38 as shown schematically using arrows 60. The working fluid then flows from the second portion 48 to the first portion 46 of the heat pipe 38 via the wick 52, shown schematically using arrows 62. The heat pipe 38 may have an effective temperature operating range of between 30° C. and 120° C., for example. This is suitable for transferring heat away from the heat generating component 42, which typically generates temperatures of between approximately 60° C. and 90° C.

Returning to FIG. 1, in use, a working fluid in the form of a gaseous refrigerant is compressed by the compressor 12 to a high pressure and temperature and passes from the compressor 12 to the condenser 14 via the discharge line 20. The condenser 14 condenses the high pressure gaseous refrigerant to reject heat to the ambient heat exchange medium so as to form high pressure and high temperature condensed (i.e. liquid) refrigerant. Although not shown, the refrigeration system 10 may comprise a fan that blows air hot air from the condenser 14 away from the condenser 14, thereby increasing the rate of heat rejection. A first portion of the high pressure and high temperature condensed refrigerant passes from the condenser 14 to the expansion device 16 via the liquid line 22. The first portion of the condensed refrigerant is expanded at the expansion device 16 to provide a multi-phase refrigerant flow to the evaporator 18. The refrigerant flow provided to the evaporator 18 may be a low temperature, low pressure vapor. This first portion of the flow is evaporated in the evaporator 18, before being provided to the compressor 12 via the suction line 26. Evaporation at the evaporator 18 cools the controlled environment associated with the evaporator 18. That is, heat travels from the controlled environment to the evaporator 18. The refrigerant passing along the suction line 26 may be a temperature of −20° C., for example.

In addition, a second portion of the high pressure and high temperature condensed refrigerant passes from the condenser 14 to the additional expansion device 34 via the supply line 32. The additional expansion device 34 comprises a small orifice through which the second portion of the condensed refrigerant is expanded (i.e. flashed) to provide a multi-phase refrigerant flow, which passes along the first portion 95A of the injection line 95 to the heat pipe heat exchanger 36. The refrigerant flow may be a low temperature, low pressure vapor flow.

Returning to FIG. 3, the multi-phase refrigerant flow travelling in the direction denoted by arrow 81 passes from the first portion 95A of the injection line 95 to the interior chamber 86 of the heat pipe heat exchanger 36 via the inlet opening 80. The multi-phase refrigerant flow travels around the second portion 48 of the heat pipe 38 and out of the heat pipe heat exchanger 36 into the second portion 95B of the injection line 95 via the outlet opening 82 in the direction denoted by arrow 83.

The temperature of the power converter 40 is greater than the temperature of the multi-phase refrigerant flow passing along the injection line 95. Accordingly, heat is removed from the power converter 40, passes into the first portion 46 of the heat pipe 38 at the first thermal coupling 45, passes along the heat pipe 38 in the manner described above and is deposited from the second portion 48 of the heat pipe 38 into the multi-phase refrigerant flow passing along the injection line 95 at the second thermal coupling 47. In particular, the heat is deposited from the second portion 48 of the heat pipe 38 into the multi-phase refrigerant flow within the interior chamber 86 as it passes along the injection line 95, through the heat pipe heat exchanger 36.

The multi-phase refrigerant flow travels from the heat pipe heat exchanger 36 into the compressor 12 via the second portion 95B of the injection line 95. The refrigerant flow travelling along the second portion 95B of the injection line 95 is a low pressure vapor.

The multi-phase refrigerant is supplied to the compressor 12 part way through compression via a port in the compressor 12. This helps cool the compressor 12 slightly so as to increase its performance and improve the efficiency and capacity of the refrigeration circuit.

If the compressor 12 comprises two scroll sets, the refrigerant is supplied to the compressor 12 between the two stages. If the compressor 12 is a two-stage rotary type compressor, the refrigerant may be supplied to the compressor 12 after the first stage of the compressor 12 and before the second stage of the compressor 12. If the compressor 12 comprises two pistons, the refrigerant may be supplied to the compressor 12 between the two pistons at the mid-point of compression. The second end of the injection line 95 may alternatively be fluidically connected to the suction line 26 at a point upstream of the compressor 12 such that the injection line 95 is fluidically connected to the compressor 12 via a portion of the suction line 26 and such that the compressor 12 is configured to receive the expanded fluid from the additional expansion device 34 via the injection line 95 and a portion of the suction line 26.

The heat pipe 38 is able to transfer heat from the power converter 40 to strategic spots in the refrigeration circuit without need for additional pumps or fans. Since the heat pipe 38 is not a mechanical (i.e. moving) component (e.g. a pump or fan), it is less likely to fail and does not induce mechanical vibrations in the power converter 40. Using a heat pipe 38 in the manner described above reduces expense, weight and maintenance requirements, and reduces moisture, leaks and hot and cold cycles. The heat pipe 38 can be routed through refrigerant circuits having complex geometries (e.g. around bends, etc.) and does not need to rely on a gravity vector to work. The heat pipe 38 is a high reliability sealed system that has a relatively constant temperature that can transfer heat from the power converter 40 at a relatively fast rate. Evaporation takes place within the heat pipe 38 at a relatively constant temperature, thereby making the heat pipe relatively efficient at extracting heat from the power converter 40.

The heat pipe 38 improves the operation of the power converter 40 by maintaining it at a low enough temperature, but also improves the operation of the compressor 12 by heating the refrigerant passing from the additional expansion device 34 to the compressor 12, thereby preventing liquid reaching the compressor 12 which could damage the compressor 12 or effect its performance and efficiency. The refrigeration system capacity far exceeds the additional power dissipated. For example, the heat pipe 38 may need to dissipate 200 watts of heat to maintain the power converter 40 at a constant temperature and the refrigeration system is able to provide 5 kilowatts of cooling to the heat pipe 38, if necessary. Further, since the power converter 40 is used to power the compressor 12, the need to cool the power converter 40 is at its greatest when the compressor 12 is being operated, and, thus, when the additional expansion device 34 is able to cool the heat pipe 38 and, in turn, the power converter 40. Accordingly, the arrangement of the first example refrigeration system 10 provides multiple advantageous functions simultaneously.

FIG. 4 schematically shows a second example refrigeration system 210. The components of the second example refrigeration system 210 correspond to the components of the first example refrigeration system 10, are denoted using corresponding reference numerals and function in a corresponding manner except where stated below.

The second example refrigeration system 210 differs from the first example refrigeration system 10 in that it does not comprise a heat pipe heat exchanger 36.

The second example refrigeration system 210 instead comprises an economizer heat exchanger 88. The economizer heat exchanger 88 comprises a casing (also indicated at reference numeral 88) defining an interior chamber. A first portion 95A of the injection line 95 fluidically connects the additional expansion device 34 to the economizer heat exchanger 88 at an inlet port defined by the casing. A second portion 95B of the injection line 95 is connected to an outlet port defined by the casing and fluidically connects the economizer heat exchanger 88 to the compressor 12. Accordingly, the economizer heat exchanger 88 is disposed in flow series between the additional expansion device 34 and the compressor 12. The liquid line 22 extends into and out of the casing, through the interior chamber. Accordingly, the economizer heat exchanger 88 is also in flow series between the condenser 14 and the expansion device 16.

During operation, the economizer heat exchanger 88 receives the multi-phase refrigerant flow passing along the first portion 95A of the injection line 95 and the portion of the condensed refrigerant passing along the liquid line 22 while preventing physical mixing of the respective flows. The refrigerant entering the economizer heat exchanger 88 via the liquid line 22 may be approximately 60° C. before it enters the economizer heat exchanger 88. The economizer heat exchanger 94 thermally couples the injection line 95 to the liquid line 22 such that heat is transferred from the liquid line 22 to the injection line 95. The economizer heat exchanger 88 therefore removes heat from working fluid in the liquid line 22 prior to expansion by the expansion device 16 and evaporation by the evaporator 18. The refrigerant leaving the economizer heat exchanger 88 via the liquid line 22 may be a warm (e.g. approximately 20° C.), high pressure liquid.

The second portion 48 of the heat pipe 38 and the economizer heat exchanger 88 are configured such that a second thermal coupling 47 is formed between the second portion 48 of the heat pipe 38 and the economizer heat exchanger 88. In particular, the economizer heat exchanger 88 defines a hole 39 that receives the second portion 48 of the heat pipe 38 (represented within the economizer heat exchanger 88 in dashed lines in FIG. 4). The second portion 48 of the heat pipe 38 thus extends into the interior chamber so as to mechanically and thermally couple the economizer heat exchanger 88 and the second portion 48 of the heat pipe 38 and such that heat is transferred from the second portion 48 of the heat pipe 38 to the economizer heat exchanger 88.

FIG. 5 schematically shows a third example refrigeration system 310. The components of the third example refrigeration system 310 correspond to the components of the second example refrigeration system 210, are denoted using corresponding reference numerals and function in a corresponding manner except where stated below.

The third example refrigeration system 310 differs from the second example refrigeration system 210 in that a second thermal coupling 47 is not formed between the second portion 48 of the heat pipe 38 and the economizer heat exchanger 88.

Instead, the second portion 48 of the heat pipe 38 and the first portion 95A of the injection line 95 are configured such that a second thermal coupling 47 is formed between the second portion 48 of the heat pipe 38 and the first portion 95A of the injection line 95. In particular, the third example refrigeration system 310 comprises a heat pipe heat exchanger 36 of the type described above. The heat pipe heat exchanger 36 is disposed along the first portion 95A of the injection line 95. The second portion 48 of the heat pipe 38 is coupled to the heat pipe heat exchanger 36 in the manner described above with reference to FIG. 3 such that, during operation, heat is transferred from the second portion 48 of the heat pipe 38 to the first portion 95A of the injection line 95.

The heat pipe heat exchanger 36 is separated from the economizer heat exchanger 88 by a portion of the first portion 95A of the injection line 95 downstream of the heat pipe heat exchanger 36. Accordingly, the heat pipe heat exchanger 36 and the economizer heat exchanger 88 are separate components.

FIG. 6 schematically shows a fourth example refrigeration system 410. The components of the fourth example refrigeration system 410 correspond to the components of the second example refrigeration system 210, are denoted using corresponding reference numerals and function in a corresponding manner except where stated below.

The fourth example refrigeration system 410 differs from the second example refrigeration system 210 in that a second thermal coupling 47 is not formed between the second portion 48 of the heat pipe 38 and the economizer heat exchanger 88.

Instead, the second portion 48 of the heat pipe 38 and the second portion 95B of the injection line 95 are configured such that a second thermal coupling 47 is formed between the second portion 48 of the heat pipe 38 and the second portion 95B of the injection line 95. In particular, the fourth example refrigeration system 410 comprises a heat pipe heat exchanger 36 of the type described above. The heat pipe heat exchanger 36 is disposed along the second portion 95B of the injection line 95. The second portion 48 of the heat pipe 38 is coupled to the heat pipe heat exchanger 36 in the manner described above with reference to FIG. 3 such that, during operation, heat is transferred from the second portion 48 of the heat pipe 38 to the second portion 95B of the injection line 95.

The heat pipe heat exchanger 36 is separated from the economizer heat exchanger 88 by a portion of the second portion 95B of the injection line 95 upstream of the heat pipe heat exchanger 36. Accordingly, the heat pipe heat exchanger 36 and the economizer heat exchanger 88 are separate components.

FIG. 7 schematically shows a fifth example refrigeration system 510. The components of the fifth example refrigeration system 510 correspond to the components of the second example refrigeration system 210, are denoted using corresponding reference numerals and function in a corresponding manner except where stated below.

The fifth example refrigeration system 510 differs from the second example refrigeration system 210 in that a second thermal coupling 47 is not formed between the second portion 48 of the heat pipe 38 and the economizer heat exchanger 88.

Instead, the fifth example refrigeration system 510 comprises a heat pipe heat exchanger 36 of the type described above. The heat pipe heat exchanger 36 is disposed along the second portion 95B of the injection line 95. The second portion 48 of the heat pipe 38 is coupled to the heat pipe heat exchanger 36 in the manner described above with reference to FIG. 3 such that, during operation, heat is transferred from the second portion 48 of the heat pipe 38 to the second portion 95B of the injection line 95.

The heat pipe heat exchanger 36 is separated from the economizer heat exchanger 88 by a portion of the second portion 95B of the injection line 95 upstream of the heat pipe heat exchanger 36. Accordingly, the heat pipe heat exchanger 36 and the economizer heat exchanger 88 are separate components.

The fifth example refrigeration system 510 further comprises a further expansion device 34', a further injection line 95' and a further supply line 32'. A first end of the further supply line 32' branches from and is fluidically connected to the liquid line 22. A second end of the further supply line 32' is fluidically connected to the further expansion device 34'. Accordingly, the further expansion device 34' is fluidically connected to the liquid line 22 by the further supply line 32' so as to receive fluid from the liquid line 22. The further expansion device 34' is a solenoid valve configured to expand the fluid received from the liquid line 22 so as to form expanded fluid.

A first end of the further injection line 95' is fluidically connected to the further expansion device 34'. A second end of the further injection line 95' is fluidically connected to the heat pipe heat exchanger 36, which, in the fifth example refrigeration system 510, may comprise an additional inlet for such a connection. Accordingly, the second portion of the injection line is configured to receive the expanded fluid from the further expansion device 34' via the further injection line 95'.

During operation, a portion of the high pressure and high temperature condensed refrigerant passes from the condenser 14 to the further expansion device 34' via the further injection line 95'. The further expansion device 34' comprises a small orifice through which the portion of the condensed refrigerant is expanded (i.e. flashed) to provide a multi-phase refrigerant flow, which passes along the further injection line 95' to the heat pipe heat exchanger 36 and then onwards to the compressor 12.

Accordingly, the second portion 48 of the heat pipe 38, the second portion of the injection line 95B and the further injection line 95' are configured such that a second thermal coupling 47 is formed between the second portion 48 of the heat pipe 38, the second portion of the injection line 95B and the further injection line 95'.

FIG. 8 schematically shows a sixth example refrigeration system 610. The components of the sixth example refrigeration system 610 correspond to the components of the first example refrigeration system 10, are denoted using corresponding reference numerals and function in a corresponding manner except where stated below.

In particular, the sixth example refrigeration system 610 differs from the first example refrigeration system 10 in that it does not comprise an injection line 95 or a further expansion device 34.

Instead, the sixth example refrigeration system 610 comprises a liquid to suction line heat exchanger 94 (also referred to as a liquid line/suction line heat exchanger or LLSL-HX). The liquid to suction line heat exchanger 94 is configured to place working fluid in the liquid line 22 and working fluid in the suction line 26 in heat exchange communication. In particular, the liquid to suction line heat exchanger 94 comprises a casing (also denoted using reference numeral 94) defining an interior chamber. A first portion 26A of the suction line 26 fluidically connects the evaporator 18 to the liquid to suction line heat exchanger 94 at an inlet port defined by the casing. A second portion 26B of the suction line 26 is connected to an outlet port defined by the casing and fluidically connects the liquid to suction line heat exchanger 94 to the compressor 12. Accordingly, the liquid to suction line heat exchanger 94 is disposed in flow series between the evaporator 18 and the compressor 12. The liquid line 22 extends into and out of the casing, through the interior chamber. Accordingly, the liquid to suction line heat exchanger 94 is also in flow series between the condenser 14 and the expansion device 16.

The liquid to suction line heat exchanger 94 has the effect of removing heat from working fluid in the liquid line 22 prior to expansion by the expansion device 16 and evaporation by the evaporator 18 (i.e. subcooling the working the fluid) and transferring this heat to raise the temperature of the working fluid in the suction line 26 prior to compression by the compressor 12. Accordingly, the suction to liquid line heat exchanger 94 is configured to thermally couple the suction line 26 to the liquid line 22 such that heat is transferred from the liquid line 22 to the suction line 26.

The second portion 48 of the heat pipe 38 and the suction to liquid line heat exchanger 94 are configured such that a second thermal coupling 47 is formed between the second portion 48 of the heat pipe 38 and the suction to liquid line heat exchanger 94. In particular, the suction to liquid line heat exchanger 94 defines a hole 39 that receives the second portion 48 of the heat pipe 38 (represented within the liquid to suction line heat exchanger 94 in dashed lines in FIG. 8). The second portion 48 of the heat pipe 38 thus extends into the interior chamber so as to mechanically and thermally couple the suction to liquid line heat exchanger 94 and the second portion 48 of the heat pipe 38 and such that heat is transferred from the second portion 48 of the heat pipe 38 to the suction to liquid line heat exchanger 94.

FIG. 9 schematically shows a seventh example refrigeration system 710. The components of the seventh example refrigeration system 710 correspond to the components of the sixth example refrigeration system 610, are denoted using corresponding reference numerals and function in a corresponding manner except where stated below.

In particular, the seventh example refrigeration system 710 further comprises an injection line 95, a further expansion device 34 and a supply line 32. A first end of the supply line 32 branches from and is fluidically connected to the liquid line 22. A second end of the supply line 32 is fluidically connected to the further expansion device 34. Accordingly, the further expansion device 34 is fluidically connected to the liquid line 22 by a supply line 32 so as to receive fluid from the liquid line 22. The further expansion device 34 is configured to expand the fluid received from the liquid line 22 so as to form expanded fluid.

A first end of the injection line 95 is fluidically connected to the further expansion device 34. A second end of the injection line 95 is fluidically connected to the liquid to suction line heat exchanger 94. Accordingly, the liquid to suction line heat exchanger 94 is configured to receive the expanded fluid from the further expansion device 34 via the injection line 95.

The second portion 48 of the heat pipe 38 and the suction to liquid line heat exchanger 94 are configured such that a second thermal coupling 47 is formed between the second portion 48 of the heat pipe 38 and the suction to liquid line heat exchanger 94. In particular, the suction to liquid line heat exchanger 94 defines a hole 39 that receives the second portion 48 of the heat pipe 38 (represented within the economizer heat exchanger in dashed lines in FIG. 1). The second portion 48 of the heat pipe 38 thus extends into the interior chamber so as to mechanically and thermally couple the suction to liquid line heat exchanger 94 and the second portion 48 of the heat pipe 38 and such that heat is transferred from the second portion 48 of the heat pipe 38 to the suction to liquid line heat exchanger 94.

FIG. 10 schematically shows an eighth example refrigeration system 810. The components of the eighth example refrigeration system 810 correspond to the components of the seventh example refrigeration system 710, are denoted using corresponding reference numerals and function in a corresponding manner except where stated below.

In particular, the eighth example refrigeration system 810 differs from the seventh example refrigeration system 710 in that the second portion 48 of the heat pipe 38 and the suction to liquid line heat exchanger 94 are not configured such that a second thermal coupling 47 is formed between the second portion 48 of the heat pipe 38 and the suction to liquid line heat exchanger 94.

Instead, the second portion 48 of the heat pipe 38 and the injection line 95 are configured such that a second thermal coupling 47 is formed between the second portion 48 of the heat pipe 38 and the injection line 95. In particular, the eighth example refrigeration system 810 comprises a heat pipe heat exchanger 36 of the type described above. The heat pipe heat exchanger 36 is disposed along the injection line 95. The second portion 48 of the heat pipe 38 is coupled to the heat pipe heat exchanger 36 in the manner described above with reference to FIG. 3 such that, during operation, heat is transferred from the second portion 48 of the heat pipe 38 to the injection line 95.

The heat pipe heat exchanger 36 is separated from the economizer heat exchanger 88 by a portion of the injection line 95 downstream of the heat pipe heat exchanger 36. Accordingly, the heat pipe heat exchanger 36 and the economizer heat exchanger 88 are separate components.

FIG. 11 schematically shows a ninth example refrigeration system 910. The components of the ninth example refrigeration system 910 correspond to the components of the first example refrigeration system 10, are denoted using corresponding reference numerals and function in a corresponding manner except where stated below.

In particular, the ninth example refrigeration system 910 differs from the first example refrigeration system 10 in that does not comprise an injection line 95 or an additional expansion device 34, and a second thermal coupling 47 is not formed between the second portion 48 of the heat pipe 38 and an injection line.

The second portion 48 of the heat pipe 38 and the evaporator 18 are configured such that a second thermal coupling 47 is formed between the second portion 48 of the heat pipe 38 and the evaporator 18. In particular, the evaporator 18 defines a hole 39 that receives the second portion 48 of the heat pipe 38 (represented within the evaporator 18 in dashed lines in FIG. 11) so as to mechanically and thermally couple the evaporator 18 and the second portion 48 of the heat pipe 38 and such that heat is transferred from the second portion 48 of the heat pipe 38 to the evaporator 18. In this manner, the body of the evaporator 18 forms a heat exchanger between the evaporator 18 and the second portion 48 of the heat pipe 38. The second portion 48 of the heat pipe 38 may be physically coupled to coil tubes of the evaporator 18.

FIG. 12 schematically shows a tenth example refrigeration system 1010. The components of the tenth example refrigeration system 1010 correspond to the components of the first example refrigeration system 10, are denoted using corresponding reference numerals and function in a corresponding manner except where stated below.

In particular, the tenth example refrigeration system 1010 differs from the first example refrigeration system 10 in that does not comprise an injection line 95 or an additional expansion device 34, and a second thermal coupling 47 is not formed between the second portion 48 of the heat pipe 38 and an injection line.

The second portion 48 of the heat pipe 38 and the condenser 14 are configured such that a second thermal coupling 47 is formed between the second portion 48 of the heat pipe 38 and the condenser 14. In particular, the condenser 14 defines a hole 39 that receives the second portion 48 of the heat pipe 38 (represented within the condenser 14 in dashed lines in FIG. 12) so as to mechanically and thermally couple the condenser 14 and the second portion 48 of the heat pipe 38 and such that heat is transferred from the second portion 48 of the heat pipe 38 to the condenser. In this manner, the body of the condenser 14 forms a heat exchanger between the condenser 14 and the second portion 48 of the heat pipe 38. The second portion 48 of the heat pipe 38 may be physically coupled to coil tubes of the condenser 14.

FIG. 13 schematically shows an eleventh example refrigeration system 1110. The components of the eleventh example refrigeration system 1110 correspond to the components of the second example refrigeration system 210, are denoted using corresponding reference numerals and function in a corresponding manner except where stated below.

In particular, the eleventh example refrigeration system 1110 differs from the second example refrigeration system 210 in that it comprises a first alternative economizer heat exchanger 1188 rather than the economizer heat exchanger 88 referred to above. The first alternative economizer heat exchanger 1188 is a countercurrent heat exchanger (sometimes referred to as a counterflow heat exchanger).

The first alternative economizer heat exchanger 1188 substantially corresponds to the economizer heat exchanger 88 referred to above. However, the first and second portions 95A, 95B of the injection line 95 are connected by a fluid line that extends through the interior chamber of the casing 1188. The fluid line is arranged such that the general direction of travel of the fluid through the fluid line opposes the general direction of travel of the fluid through the liquid line 22 so as to increase the amount of heat exchange. In such a system, the casing may be omitted.

The expansion device 34 of the eleventh example refrigeration system 1110 is a solenoid valve configured to expand the fluid received from the supply line 32 so as to form expanded fluid.

FIG. 14 schematically shows a twelfth example refrigeration system 1210. The components of the twelfth example refrigeration system 1210 correspond to the components of the third example refrigeration system 310, are denoted using corresponding reference numerals and function in a corresponding manner except where stated below.

In particular, the twelfth example refrigeration system 1210 differs from the third example refrigeration system 310 in that it comprises a second alternative economizer heat exchanger 1288 rather than the economizer heat exchanger 88 referred to above. The second alternative economizer heat exchanger 1288 is a countercurrent heat exchanger (sometimes referred to as a counterflow heat exchanger).

The second alternative economizer heat exchanger 1288 substantially corresponds to the economizer heat exchanger 88 referred to above. However, the first and second portions 95A, 95B of the injection line 95 are connected by a fluid line that extends through the interior chamber of the casing 1288. In the arrangement shown in FIG. 14, the fluid line is intertwined with the liquid line 22 so as to increase the amount of heat exchange. However, this need not be the case (e.g. the fluid line and liquid line 22 could be disposed next to each other). The fluid line is arranged such that the general direction of travel of the fluid through the fluid line opposes the general direction of travel of the fluid through the liquid line 22 so as to increase the amount of heat exchange. In such a system, the casing may be omitted.

The expansion device 34 of the twelfth example refrigeration system 1210 is a solenoid valve configured to expand the fluid received from the supply line 32 so as to form expanded fluid.

FIG. 15 schematically shows a thirteenth refrigeration system 1310. The components of the thirteenth refrigeration system 1310 correspond to the components of the sixth example refrigeration system 610, are denoted using corresponding reference numerals and function in a corresponding manner except where stated below.

In particular, the thirteenth refrigeration system 1310 differs from the sixth example refrigeration system 610 in that it comprises an alternative suction to liquid line heat exchanger 1394 rather than the suction to liquid line heat exchanger 94 referred to above. The second alternative economizer heat exchanger 1288 is a countercurrent heat exchanger (sometimes referred to as a counterflow heat exchanger).

The alternative suction to liquid line heat exchanger 1394 substantially corresponds to the suction to liquid line heat exchanger 94 referred to above. However, the liquid line 22 extends through the interior chamber of the casing 1288. In the arrangement shown in FIG. 15, the fluid line is intertwined with the liquid line 22 so as to increase the amount of heat exchange. However, this need not be the case (e.g. the fluid line and liquid line 22 could be disposed next to each other). In such a system, the casing may be omitted.

FIG. 16 is a cross-sectional view of an alternative second thermal coupling 147 formed between the second portion 48 of the heat pipe 38 and the injection line 95 by an alternative heat pipe heat exchanger 136. The alternative heat pipe heat exchanger 136 may be used instead of the heat pipe heat exchanger 36. The alternative second thermal coupling 147 may be formed of copper.

The alternative heat pipe heat exchanger 136 comprises a tubular portion 62 having an inlet opening 1080 (shown in dashed lines in FIG. 16) at a first end and an outlet opening 1082 (also shown in dashed lines in FIG. 16) at a second end. The tubular portion 62 is substantially cylindrical and extends around a central axis 1031. The tubular portion 62 is connected at the first end to the first portion 95A of the injection line 95 such that fluid from the first portion 95A of the injection line 95 is able to enter the tubular portion 62 via the inlet opening 1080 in the direction shown by arrow 1081. The tubular portion 62 is connected at the second end to the second portion 95B of the injection line 95 such that fluid from the tubular portion 62 is able to enter the second portion 95B of the injection line 95 via the outlet opening 1082 in the direction shown by arrow 1083.

The alternative heat pipe heat exchanger 136 further comprises a tubular sleeve 64 extending perpendicularly from the tubular portion 62 such that the housing is substantially T-shaped. The tubular sleeve 64 is substantially cylindrical and extends around an axis 37. The tubular sleeve 64 has a through hole 1084 extending from a distal end of the tubular sleeve 64 to the tubular portion 62 that receives the second portion 48 of the heat pipe 38 and a proximal closed end adjacent the injection line 95. The second portion 48 of the heat pipe 38 extends into the interior of the tubular portion 62 via the through hole 1084 such that the heat pipe 38 is in direct contact with and able to exchange heat with any refrigerant passing through the tubular portion 62 during operation. The heat pipe 38 can be brazed, soldered or glued into the tubular sleeve 64 so as to prevent leaks.

FIG. 17 is a cross-sectional view of an alternative first thermal coupling 245 formed between the first portion 46 of the heat pipe 38 and the power converter 40 by an alternative heat sink 244. The alternative first thermal coupling 245 may be used instead of the first thermal coupling 45.

The alternative heat sink 244 comprises a first heat sink portion 202 and a second heat sink portion 204 that are mechanically and thermally coupled to each other and to the power converter. A second heat pipe 206 extends between the first heat sink portion 202 and a second heat sink portion 204. The first and second heat sink portion 202, 204 together form a cold plate. The second heat pipe 206 has a similar structure to the heat pipe 38 and functions in a corresponding manner to the heat pipe 38.

A detachable housing 208 defines a hole 214 that receives the first portion 46 of the heat pipe 38. The detachable housing 208 is detachably connected to the second heat sink portion 204 by a screw 210. A thermal interface paste or pad 212 is disposed between the detachable housing 208 and the second heat sink portion 204 and the detachable housing 208. The thermal interface paste or pad 212 thermally couples the second heat sink portion 204 and the detachable housing 208, and may electrically insulate the second heat sink portion 204 and the detachable housing 208 from each other. The thermal paste or pad 212 may electrically isolate the power converter 40 and the heat pipe 206. This lowers potential, and, thus, leakage current. The second heat sink portion 204 (and, thus, the power converter 40 connected thereto) can be uncoupled from the detachable housing 208 for servicing, repair or replacement.

In use, the second heat pipe 206 receives heat generated by the heat generating component 42, which is transferred to the second heat sink portion 204. The heat then passes through the thermal interface paste or pad 212, into the detachable housing 208 and into the first portion 46 of the heat pipe 46 where it is transferred to the second portion 48 of the heat pipe 48 as described above with reference to FIG. 2. The heat sink 44 further comprises a plurality of fins 268 configured to remove excess heat not transferred to the first portion 46 of the heat pipe 38 to the surrounding atmosphere.

As schematically shown in FIGS. 1 and 4 to 12, the refrigeration systems described above may comprise a temperature sensor 146 and a controller 148 in communication with the temperature sensor 146. Although not shown the abovementioned Figures, the temperature sensor 146 may be positioned in or adjacent the power converter 40 (e.g. at or near the heat generating component 42) or the heat pipe 38. The temperature sensor 146 is configured to generate a signal indicative of a temperature at or near the power converter 40 (e.g. at or near the heat generating component 42) or the heat pipe 38. The controller 148 is configured to control a state of one or more of the expansion devices based on the signal generated by the temperature sensor 146 in accordance with a method 1400, and thereby control the amount of cooling of the power converter 40 via the heat pipe 38 based on the signal generated by the temperature sensor 146.

FIG. 18 is a flowchart of the method 1400 of operating the refrigeration systems or heat pumps described above. In a first step 1410 of the method 1400, a parameter of the refrigeration system or heat pump is determined. In a second step 1420 of the method 1400, a variable component of the refrigeration system or heat pump is modulated based on the determined parameter.

The variable component of the refrigeration system or heat pump may be one or more of an expansion device 16, an additional expansion device 34 and/or a further expansion device 34'. For example, the variable component may be the additional expansion device 34 in the first to fourth refrigeration systems, 10, 210, 310, 410, the variable component may be the expansion device 34 and/or the further expansion device 34' in the fifth refrigeration system 510, the variable component may be the expansion device 16 in the sixth, ninth and tenth refrigeration systems 610, 910, 1010, and the variable component may be the state of the additional expansion device 34 and/or the expansion device 16 in the seventh and eighth refrigeration systems 710, 810.

The parameter of the refrigeration system or heat pump may be a temperature as determined by the temperature sensor 146. The variable component of the refrigeration system or heat pump may be modulated 1420 to reduce an error between the temperature and a target temperature or to bring the temperature within a target range of temperatures.

For example, in the first step 1410, the controller 148 may determine a temperature measured by the temperature sensor 146 based on a signal received from the temperature sensor 146. In the second step 1420, the controller 148 may determine whether the determined temperature is above or below a target temperature (i.e. whether there is an error between the determined temperature and the target temperature), and, if above, open (or increase the extent of opening of) one or more of the expansion devices so as to increase the rate of cooling of the power converter 40, and, if below, close (or reduce the extent of opening of) one or more of the expansion devices so as to reduce the rate of cooling of the power converter 40.

Alternatively, in the second step 1420, the controller 148 may determine whether the determined temperature is above or below a target range of temperatures, and, if the determined temperature is above the target range of temperatures, open (or increase the extent of opening of) one or more of the expansion devices so as to increase the rate of cooling of the power converter 40, and, if the determined temperature is below the target range of temperatures, close (or reduce the extent of opening of) one or more of the expansion devices so as to reduce the rate of cooling of the power converter 40. Accordingly, the power converter 40, heat generating component 42 or heat pipe 38 may be kept close to a target temperature or within a target range of temperatures by controlling operation of the expansion devices. This improves the reliability and useful life of the power converter 40.

In an alternative embodiment of the method 1400, the first step 1410 may alternatively comprise generating an alternative signal or signals that are indirectly related to the cooling requirement of the power converter 40. For example, the refrigeration systems may comprise means for generating signals that can be used to determine the power dissipated by the power converter 40 (e.g. a wattmeter, an ammeter, a voltmeter, an ohmmeter, etc.). The method 1400 may additionally comprise determining the power dissipation of the power converter 40 based on the signals using conventional techniques, ether locally at the power converter 40 or at the controller 148.

For example, in the second step 1420 of such an alternative method 1400, the controller 148 may open (or increase the extent of opening of) one or more of the expansion devices so as to increase the rate of cooling of the power converter 40 when the power dissipation is above an upper value or range of values. Conversely, the controller 148 may close (or reduce the extent of opening of) one or more of the expansion devices so as to reduce the rate of cooling of the power converter 40 when the power dissipation is below a lower value or range of values.

In a further alternative embodiment of the method 1400, the flow of fluid to the expansion devices may be controlled in step 1420 rather than controlling the expansion devices themselves. For example, a separate flow control device (e.g. an additional valve) may be disposed upstream of the expansion devices that is controlled (e.g. modulated between fully open, partially open or closed positions) to vary the flow rate of fluid passing to the expansion devices, and, thus, the rate of cooling of the power converter 40. Alternatively, the speed of the compressor 12 can instead be adjusted, with an increase in the speed of the compressor 12 resulting in an increase in the flow rate of fluid passing through the expansion devices, and, thus, an increase in the amount of cooling of the heat pipe 48 and the power converter 40 or power module.

In the above arrangements, the expansion devices may be expansion valves such as thermostatic expansion valves (i.e. thermal expansion valves) or electronic expansion valves. Alternatively, in the above arrangements the expansion devices may be solenoid valves comprising orifices capable of flashing off (e.g. small enough to flash off) vapor. The solenoid valves may be controlled in the manner described above. The expansion devices may alternatively be capillary tubes or orifices.

In the arrangement of FIGS. 4 to 7, 9, 10, the first end of the supply line 32 branches from the liquid line 22 upstream of the economizer heat exchanger 88 and the suction to liquid line heat exchanger 94. However, in alternative arrangements, the first end of the supply line 32 may instead branch from the liquid line 22 downstream of the economizer heat exchanger 88 and the suction to liquid line heat exchanger 94.

Although it has been described in each of the above arrangements that a single heat pipe 38 is used to cool the power converter 40, in alternative embodiments multiple heat pipes 38 may instead be used. A first portion 46 of each of the heat pipes 38 and the power converter 40 may be configured such that a first thermal coupling 45 is formed between the first portion 46 of each of the heat pipe 38 and the power converter 40. Alternatively, the first portion 46 of each of the heat pipes 38 may form respective first thermal couplings 45 with different respective power converters 40. The second portion 48 of each of the heat pipes 38 may be connected to different respective components of the refrigeration system described above. Multiple heat pipes may be used in parallel to increase heat movement from a heat generating device to its respective heat rejection location.

Although it has been described that the abovementioned systems are refrigeration systems, they may alternatively be heat pumps. In such arrangements, the evaporator 18 instead receives heat from the ambient heat exchange medium and the condenser 14 instead discharges heat to the controlled environment. Alternatively, a four-way or reversing valve can be used to modify the direction of the flow of fluid through the systems such that the component that formerly functions as a condenser instead functions as an evaporator and vice versa.

Although the types of heat pipes described above are tubular heat pipes, planar heat pipes (also referred to as vapor chamber) may be used instead.

In the present specification, the term thermal coupling refers the state in which a first component is configured to receive heat from a second component in a manner that is not achieved by convection or advection of fluid passing along the main fluid lines (e.g. the discharge line 20, the liquid line 22, the distribution line 24, the suction line 26, the supply line 32, the further supply line 32', the injection line 95 or the further injection line 95').

In the present specification, it is described that components of the refrigeration systems are thermally coupled together. It will be appreciated that heat that passes between the components via the thermal coupling is transferred from and to the fluid contained within the respective components.

In the present specification, it is described that a first thermal coupling 45 is formed between the first portion 46 of the heat pipe 38 and the power converter 40 by way of a power converter heat sink 44 or an alternative heat sink 224. However, the first thermal coupling may instead be formed between the first portion 46 of the heat pipe 38 and the power converter 40 by other means, such as by simply placing the first portion 46 of the heat pipe 38 in direct physical contact with the power converter 40.

In the present specification, it is described that a second thermal coupling 47 is formed between the second portion 48 of the heat pipe 38 and a component of the refrigeration system by way of a heat pipe heat exchanger 36 or an alternative heat pipe heat exchanger 136. However, the second thermal coupling may instead be formed between the second portion 48 of the heat pipe 38 and the component of the refrigeration system by other means, such as by simply placing the second portion 48 of the heat pipe 38 in direct physical contact with the component of the refrigeration system (e.g. tube on tube).

The power converter 40 may alternatively be a power module for supplying electrical power.

Although it has been described that the heat generating component 42 is a semiconductor device, it may alternatively be another component of the power converter 40 or power module, such as a bus bar.

The fourth example refrigeration system 410 may comprise a second alternative economizer heat exchanger 1288 rather than the economizer heat exchanger 88. The fifth example refrigeration system 510 may comprise a second alternative economizer heat exchanger 1288 rather than the economizer heat exchanger 88.

The sixth example refrigeration system 610 may comprise an alternative suction to liquid line heat exchanger 1394 rather than the liquid to suction line heat exchanger 94. The seventh example refrigeration system 710 may comprise an alternative suction to liquid line heat exchanger 1394 rather than the liquid to suction line heat exchanger 94. The eighth example refrigeration system 810 may comprise a suction to liquid line heat exchanger similar to the alternative suction to liquid line heat exchanger 1394 rather than the liquid to suction line heat exchanger 94, but without a hole 39 for receiving the second portion 48 of the heat pipe 38.

In an alternative embodiment of the method 1400, the first step 1410 may alternatively or additionally comprise generating signals that are indicative of the pressure of the refrigerant (e.g. using a pressure sensor at the output of the compressor 12).

Although it has been described that the first portion 46 of the heat pipe 38 and the power converter or power module 40 are mechanically and thermally coupled by a heat sink 44, this need not be the case. For example, in alternative arrangements, the heat sink may be omitted, and the first portion 46 of the heat pipe 38 and the power converter or power module 40 may be in direct contact with each other such that they are directly mechanically and thermally coupled to each other. In yet further alternative arrangements the heat sink may be omitted, and the first portion 46 of the heat pipe 38 and the power converter or power module 40 may be spaced apart from each other by an air gap that allows the first portion 46 of the heat pipe 38 and the power converter or power module 40 to be thermally coupled to each other.

Although it has been described that the second portion 48 of the heat pipe 38 and the component of the refrigeration system or heat pump are mechanically and thermally coupled by a heat exchanger, this need not be the case. For example, in alternative arrangements, the heat exchanger may be omitted, and the second portion 48 of the heat pipe 38 and the component of the refrigeration system or heat pump may be in direct contact with each other such that they are directly mechanically and thermally coupled to each other. In yet further alternative arrangements the heat exchanger may be omitted, and the second portion 48 of the heat pipe 38 and the heat exchanger may be spaced apart from each other by an air gap that allows the second portion 48 of the heat pipe 38 and the component of the refrigeration system or heat pump to be thermally coupled to each other.

Although it has been described that the power converter or power module 40 is configured to supply electrical power to the compressor 12 so as to electrically power the compressor 12, this need not be the case. For example, the power converter or power module 40 may be configured to supply electrical power to another component of the refrigeration system or heat pump or to another component that does not form part of the refrigeration system or heat pump.

The invention claimed is:

1. A refrigeration system or heat pump, comprising:
   a compressor, a condenser, a liquid line, an expansion device, an evaporator and a suction line;
   a flow path for a vapor compression cycle, the flow path extending through the compressor, the condenser, the liquid line, the expansion device, the evaporator, and the suction line to the compressor;
   a power converter or power module configured to supply electrical power; and
   a heat pipe having a first portion and a second portion;
   wherein the first portion of the heat pipe and the power converter or power module are configured such that a first thermal coupling is formed between the first portion of the heat pipe and the power converter or power module,
   wherein the second portion of the heat pipe and a component of the refrigeration system or heat pump are configured such that a second thermal coupling is formed between the second portion of the heat pipe and the component,
   wherein the heat pipe is configured to receive heat from the power converter or power module at the first portion, transfer the heat from the first portion to the second portion and transfer the heat from the second portion to the component of the refrigeration system or heat pump so as to cool the power converter or power module,
   wherein the refrigeration system or heat pump further comprises an economizer heat exchanger, an injection line and an additional expansion device,
   wherein the additional expansion device is fluidically connected to the liquid line so as to receive fluid from the liquid line and is configured to expand the fluid received from the liquid line so as to form expanded fluid,
   wherein the compressor is configured to receive the expanded fluid from the additional expansion device via the injection line,
   wherein the economizer heat exchanger is configured to thermally couple the injection line to the liquid line such that heat is transferred from the injection line to the liquid line,
   wherein the refrigeration system or heat pump further comprises a further injection line and a further expansion device,
   wherein a first portion of the injection line fluidically connects the additional expansion device to the economizer heat exchanger,
   wherein a second portion of the injection line fluidically connects the economizer heat exchanger to the compressor,
   wherein the further expansion device is fluidically connected to the liquid line so as to receive fluid from the liquid line and is configured to expand the fluid received from the liquid line so as to form expanded fluid,
   wherein the second portion of the injection line is configured to receive the expanded fluid from the further expansion device via the further injection line,
   wherein the second portion of the heat pipe, the second portion of the injection line and the further injection line are configured such that a second thermal coupling is formed between the second portion of the heat pipe, the second portion of the injection line and the further injection line.

2. The refrigeration system or heat pump of claim 1, wherein the first portion of the heat pipe and the power converter or power module are mechanically and thermally coupled by a heat sink such that the first thermal coupling is formed between the first portion of the heat pipe and the power converter or power module.

3. The refrigeration system or heat pump of claim 1, wherein the second portion of the heat pipe and the component of the refrigeration system or heat pump are mechanically and thermally coupled by a heat exchanger such that the second thermal coupling is formed between the second portion of the heat pipe and the component.

4. The refrigeration system or heat pump of claim 1, wherein the power converter or power module is configured to supply electrical power to the compressor so as to electrically power the compressor.

5. A refrigeration system or heat pump, comprising:
   a compressor, a condenser, a liquid line, an expansion device, an evaporator and a suction line;
   a flow path for a vapor compression cycle, the flow path extending through the compressor, the condenser, the liquid line, the expansion device, the evaporator, and the suction line to the compressor;
   a power converter or power module configured to supply electrical power; and
   a heat pipe having a first portion and a second portion;
   wherein the first portion of the heat pipe and the power converter or power module are configured such that a first thermal coupling is formed between the first portion of the heat pipe and the power converter or power module,
   wherein the second portion of the heat pipe and a component of the refrigeration system or heat pump are configured such that a second thermal coupling is formed between the second portion of the heat pipe and the component,
   wherein the heat pipe is configured to receive heat from the power converter or power module at the first portion, transfer the heat from the first portion to the second portion and transfer the heat from the second portion to the component of the refrigeration system or heat pump so as to cool the power converter or power module,
   wherein the refrigeration system or heat pump further comprises a suction to liquid line heat exchanger,
   wherein the suction to liquid line heat exchanger is configured to thermally couple the suction line to the liquid line such that heat is transferred from the liquid line to the suction line,
   wherein the second portion of the heat pipe and the suction to liquid line heat exchanger are configured such that a second thermal coupling is formed between the second portion of the heat pipe and the suction to liquid line heat exchanger,
   wherein the refrigeration system or heat pump further comprises an injection line and an additional expansion device,
   wherein the additional expansion device is fluidically connected to the liquid line so as to receive fluid from the liquid line and is configured to expand the fluid received from the liquid line so as to form expanded fluid,
   wherein the liquid to suction line heat exchanger is configured to receive the expanded fluid from the additional expansion device via the injection line.

6. The refrigeration system or heat pump of claim 5, wherein the first portion of the heat pipe and the power converter or power module are mechanically and thermally coupled by a heat sink such that the first thermal coupling is formed between the first portion of the heat pipe and the power converter or power module.

7. The refrigeration system or heat pump of claim 5, wherein the second portion of the heat pipe and the component of the refrigeration system or heat pump are mechanically and thermally coupled by a heat exchanger such that the second thermal coupling is formed between the second portion of the heat pipe and the component.

8. The refrigeration system or heat pump of claim 5, wherein the power converter or power module is configured to supply electrical power to the compressor so as to electrically power the compressor.

9. A refrigeration system or heat pump, comprising:
   a compressor, a condenser, a liquid line, an expansion device, an evaporator and a suction line;
   a flow path for a vapor compression cycle, the flow path extending through the compressor, the condenser, the liquid line, the expansion device, the evaporator, and the suction line to the compressor;
   a power converter or power module configured to supply electrical power; and
   a heat pipe having a first portion and a second portion;
   wherein the first portion of the heat pipe and the power converter or power module are configured such that a first thermal coupling is formed between the first portion of the heat pipe and the power converter or power module,
   wherein the second portion of the heat pipe and a component of the refrigeration system or heat pump are configured such that a second thermal coupling is formed between the second portion of the heat pipe and the component,
   wherein the heat pipe is configured to receive heat from the power converter or power module at the first portion, transfer the heat from the first portion to the second portion and transfer the heat from the second portion to the component of the refrigeration system or heat pump so as to cool the power converter or power module,
       wherein the refrigeration system or heat pump further comprises a suction to liquid line heat exchanger, an injection line and an additional expansion device,
       wherein the suction to liquid line heat exchanger is configured to thermally couple the suction line to the liquid line such that heat is transferred from the liquid line to the suction line,
       wherein the additional expansion device is fluidically connected to the liquid line so as to receive fluid from the liquid line and is configured to expand the fluid received from the liquid line so as to form expanded fluid,
       wherein the liquid to suction line heat exchanger is configured to receive the expanded fluid from the additional expansion device via the injection line,
   wherein the second portion of the heat pipe and the injection line are configured such that a second thermal coupling is formed between the second portion of the heat pipe and the injection line.

10. The refrigeration system or heat pump of claim 9, wherein the first portion of the heat pipe and the power converter or power module are mechanically and thermally coupled by a heat sink such that the first thermal coupling is formed between the first portion of the heat pipe and the power converter or power module.

11. The refrigeration system or heat pump of claim 9, wherein the second portion of the heat pipe and the component of the refrigeration system or heat pump are mechanically and thermally coupled by a heat exchanger such that the second thermal coupling is formed between the second portion of the heat pipe and the component.

12. The refrigeration system or heat pump of claim 9, wherein the power converter or power module is configured to supply electrical power to the compressor so as to electrically power the compressor.

* * * * *